(12) United States Patent
Zhang et al.

(10) Patent No.: US 8,680,577 B2
(45) Date of Patent: Mar. 25, 2014

(54) RECESSED GATE FIELD EFFECT TRANSISTOR

(75) Inventors: John H. Zhang, Fishkill, NY (US); Lawrence A. Clevenger, LaGrangeville, NY (US); Carl Radens, LaGrangeville, NY (US); Yiheng Xu, Hopewell Junction, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/494,965

(22) Filed: Jun. 12, 2012

(65) Prior Publication Data

US 2012/0313144 A1  Dec. 13, 2012

Related U.S. Application Data

(60) Provisional application No. 61/496,524, filed on Jun. 13, 2011, provisional application No. 61/497,052, filed on Jun. 14, 2011.

(51) Int. Cl.
*H01L 29/78* (2006.01)
(52) U.S. Cl.
USPC ............... 257/192; 257/E21.41; 257/E29.262
(58) Field of Classification Search
None
See application file for complete search history.

(56) References Cited

U.S. PATENT DOCUMENTS

| | | | |
|---|---|---|---|
| 7,910,444 B2 | 3/2011 | Servalli et al. | |
| 2005/0280098 A1* | 12/2005 | Shin et al. | 257/371 |
| 2007/0004126 A1 | 1/2007 | Jang | |
| 2008/0012067 A1* | 1/2008 | Wu | 257/330 |
| 2008/0076216 A1* | 3/2008 | Pae et al. | 438/257 |
| 2010/0155701 A1* | 6/2010 | Radosavljevic et al. | 257/24 |

OTHER PUBLICATIONS

Partial Search Report for European Counterpart Application No. EP 12171809.2, dated Oct. 4, 2012, 8 pages.
Notification of European Publication Number and information on Application of Article 67(3) EP for European Counterpart Application No. EP 12171809.2, dated Nov. 21, 2012, 2 pages.
Ngai, T., et al., "Transconductance Improvement in Surface-Channel SiGe P-Metal-Oxide-Silicon Field-Effect Transistors Using a $ZrO_2$ Gate Dielectric," *Microelectronics Research Center, The University of Texas*, American Institute of Physics, 2001, pp. 3085-3087.

* cited by examiner

*Primary Examiner* — Mamadou Diallo
(74) *Attorney, Agent, or Firm* — Seed IP Law Group PLLC

(57) ABSTRACT

A semiconductor device having a gate positioned in a recess between the source region and a drain region that are adjacent either side of the gate electrode. A channel region is below a majority of the source region as well as a majority of the drain region and the entire gate electrode.

9 Claims, 24 Drawing Sheets

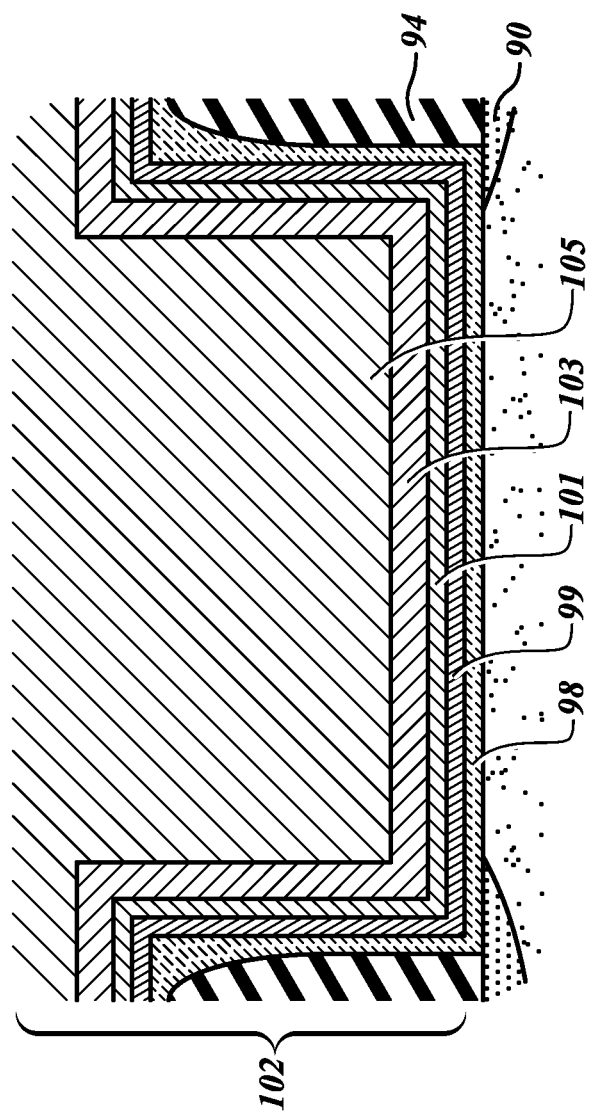

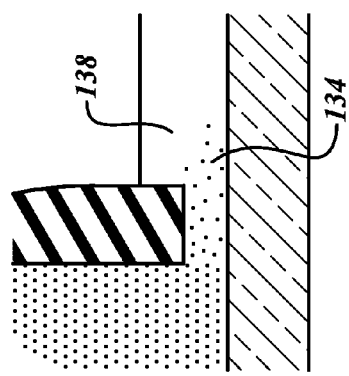

RECESSED GATE FIELD EFFECT TRANSISTOR

CROSS-REFERENCE TO RELATED APPLICATION

This application claims the benefit under 35 U.S.C. §119(e) of U.S. Provisional Patent Application Nos. 61/496,524 filed Jun. 13, 2011 and 61/497,052 filed Jun. 14, 2011 and are incorporated herein by reference in their entirety.

BACKGROUND

1. Technical Field

The present disclosure relates to a recessed gate field effect transistor.

2. Description of the Related Art

As the semiconductor manufacturers continue to explore the use of processes that are below 32 nm, traditional field effect transistor (FET) designs often fail to function properly. One characteristic of FETs that manifests undesirable traits in smaller dimensions is the increased sheet resistance of the gate. As the dimensions, and therefore the gate length, become smaller, the resistive effect of the sheet resistance of the gates of traditional FET designs increases. Increased sheet resistances at the gates results in slower switching speeds as a result of RC time delays and also requires more power.

BRIEF SUMMARY

According to one embodiment of the invention, a FET having a recessed metal gate and highly conductive source/drain extensions is disclosed. The recessed metal gate electrode has high conductivity even at very small dimensions. The source and drain have a structure that reduces the problems of channel effects, such as tunneling.

According to another embodiment of the invention, a layer of silicon germanium on a wafer is used as the channel of the FET.

According to another embodiment of the invention, an epitaxial layer is grown over a buried oxide (BOx) or over a silicon dioxide ($SiO_2$) layer and is used as the channel of the FET.

DETAILED DESCRIPTION

The following embodiments disclose a field effect transistor that is able to maintain a relatively low gate electrode sheet resistance, low junction depth, and low junction capacitance with very short gate lengths. In particular, the following embodiments disclose a semiconductor device having minimum dimensions that can range from 2-50 nm. Gate lengths of less than 28 nm, and in some instances, in the range of 2-22 nm can be achieved. Advantageously, the device minimum geometries can be easily shrunk according to the process steps disclosed herein. The process is scalable from 50 nm down to 2 nm for the gate length, while using the same basic process steps. With these techniques, integrated circuits can be manufactured at a lower cost with more transistors per chip than current field effect transistors (FETs) because each transistor has a smaller footprint and fewer, simpler process steps are used in the fabrication of the transistor structure.

Figure 1:
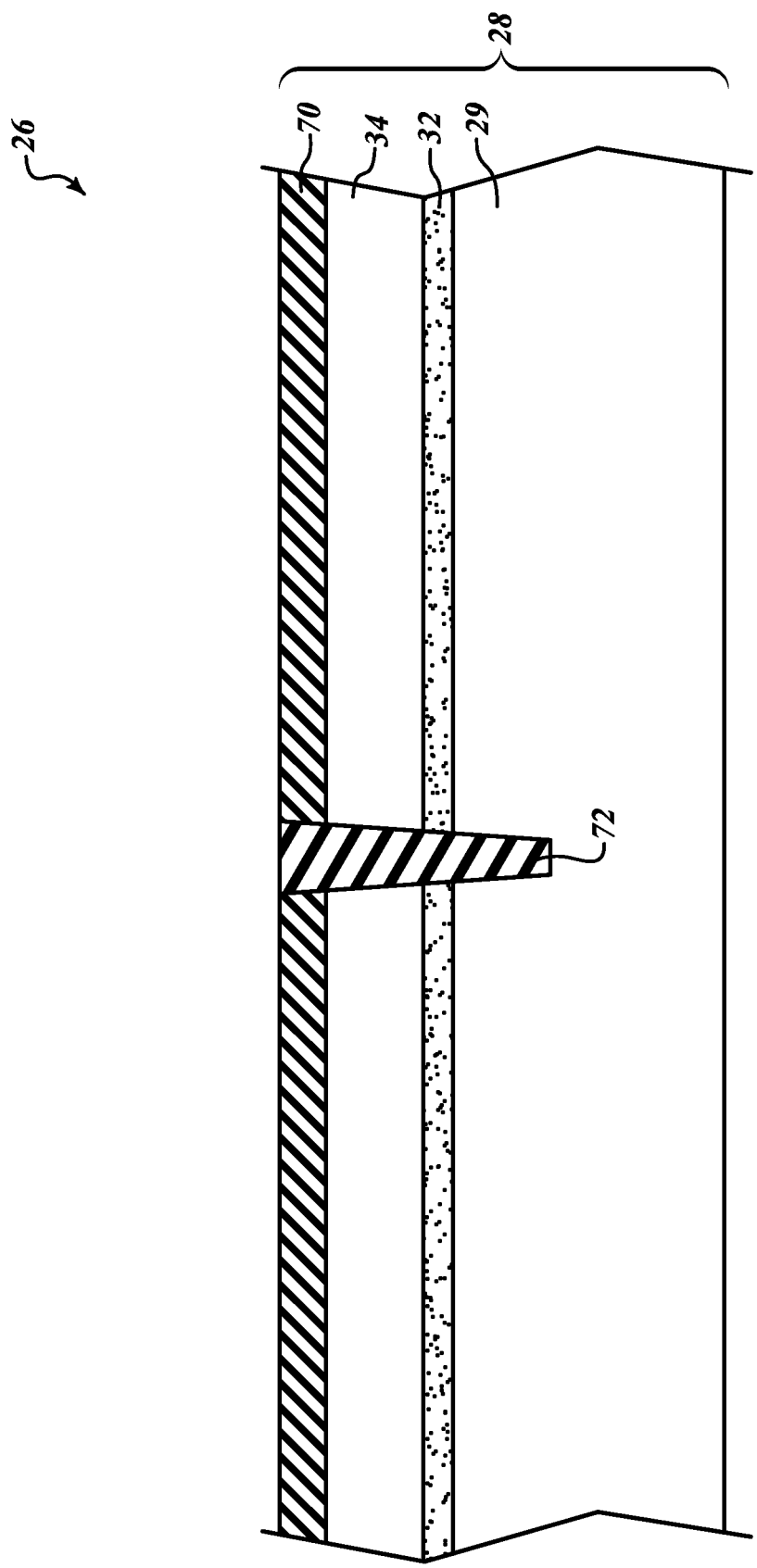
FIGS. 1-9 illustrate a process for forming an inventive semiconductor device according to a first embodiment.

FIG. 1 illustrates a simplified cross-sectional view of a first step in one embodiment of making an inventive semiconductor device 26. The same features in each of the Figures use the same reference numbers.

A wafer 28 includes multiple layers, a first monocrystalline silicon layer 29, a separating layer 32, and a second monocrystalline silicon layer 34. The monocrystalline layer 29 silicon comprises the bulk substrate of wafer 28. Alternatively, silicon layer 29 may be a monocrystalline layer that is epitaxially grown on the wafer, or a polycrystalline layer of silicon that is formed over another layer.

The silicon layer 29 is preferably doped P-type with somewhat less doping than the doping of channel regions which will be formed in layer 32 to be explained later herein. For example, the doping concentration of the bulk silicon wafer 28 may be in the range of $1\times10^{15}/cm^3$-$1\times10^{17}/cm^3$. In some embodiments, an N-well is formed in one portion of the silicon layer 29 and P-type transistors formed therein. The techniques for forming an N-well adjacent to a P-well separated by an isolation region 72 are well known in the art, and any such techniques may be used and therefore are not described in detail herein.

The separating layer 32 is formed of silicon-germanium, SiGe, according to one embodiment of the invention. SiGe is a semiconductor material that may increase the potential types of circuits and transistors that can be constructed on the wafer 28. For example, the separating layer 32 formed from SiGe may be used as a channel for a FET. It can also be used as a graded junction for a bipolar transistor on the same wafer at the identical process steps in other parts of the wafer 28. In addition, since the stress in a graded SiGe layer can be specifically controlled, use of this material as the channel permits both n and p type materials to have the channel regions custom formed to the desired stress gradient to provide high speed transistors in different parts of the wafer 28.

As is known, the percentage of germanium in the silicon lattice can be gradually varied as the layer is epitaxially formed. Preferably, at the interface between layer 32 and layer 29, only a low percentage of germanium is present, in order to avoid undesired stress at the interface between silicon layer 29 and SiGe layer 32. If desired, as the layer 32 is epitaxially grown, the germanium is gradually increased at a rate that ensures it remains monocrystalline. The percentage of germanium in the layer 32 can be varied according to particular designs as desired, and it may range between 2%-10% and at the upper surface up to 30% in some designs, though somewhat higher percentages could be used if desired and if the layer 32 is sufficiently thick. Preferably, the layer 32 is grown to a thickness in the range of 2-10 nm, with a height of 8 nm being preferred. As the layer of SiGe is grown, it is preferably not doped. Accordingly, the doping of layer 32 will take place at a later stage. In other embodiments, the layer 32 may be doped slightly with P-type material or N-type material, depending on the desired conduction properties for the particular transistors to be formed therein. The layer 32 will be used as the channel and should be doped accordingly.

Silicon layer 34 is a monocrystalline silicon or polycrystalline silicon formed over layer 32. In one embodiment, the silicon layer 34 is epitaxially grown on the SiGe layer as a single crystal layer. Since the lattice structures of Si and SiGe are sufficiently close to each other, the silicon layer 34 can be epitaxially grown on layer 32 to be assured of being a single crystal layer in which the source/drain regions of the transistors will be later formed as explained herein.

The thickness of layer 34 can range between 5 nm and 50 nm. In some instances, shallow source/drain implants will be made and shallow channel operation will be desired, in which case the layer 34 can be relatively thin, in the range of 25 nm or less. In other instances, different properties or high current densities may be desired or, bipolar transistors may be formed, in which case a somewhat thicker layer 34 is desired, in the range of 30-70 nm in thickness. In some embodiments, when extreme thin device structures are desired, the layer 34 may be only 5-8 nm in height and be the same height as layer 32.

Since layer 32 will form the channel and layer 34 the source/drains, the layer 32 can be thin for high speed and shallow channel operation and the layer 34 can be thick for low resistance in the source and drain regions. This particular design is advantageous because the height of the source and drain regions can be custom designed and selected for the particular transistor and the channel height can be custom designed and selected independent of the source/drain height. In standard transistors, the height of the channel cannot be independently formed from the height of the source/drain, but with the design of these embodiments, the source/drain is in one layer and the channel is a different layer, and in some embodiments, are made of different materials, the heights can be custom selected to be different from each other.

According to one step in the method as shown in FIG. 1, a hard mask 70 is formed on top of silicon layer 34. In one embodiment, the hard mask 70 is formed of silicon nitride (SiN). Using standard processing techniques, wafer 28 and hard mask 70 are patterned and etched and a trench isolation 72 is formed therein. According to one embodiment, the trench isolation 72 may be of the type formed in standard shallow trench isolation techniques.

Figure 2:
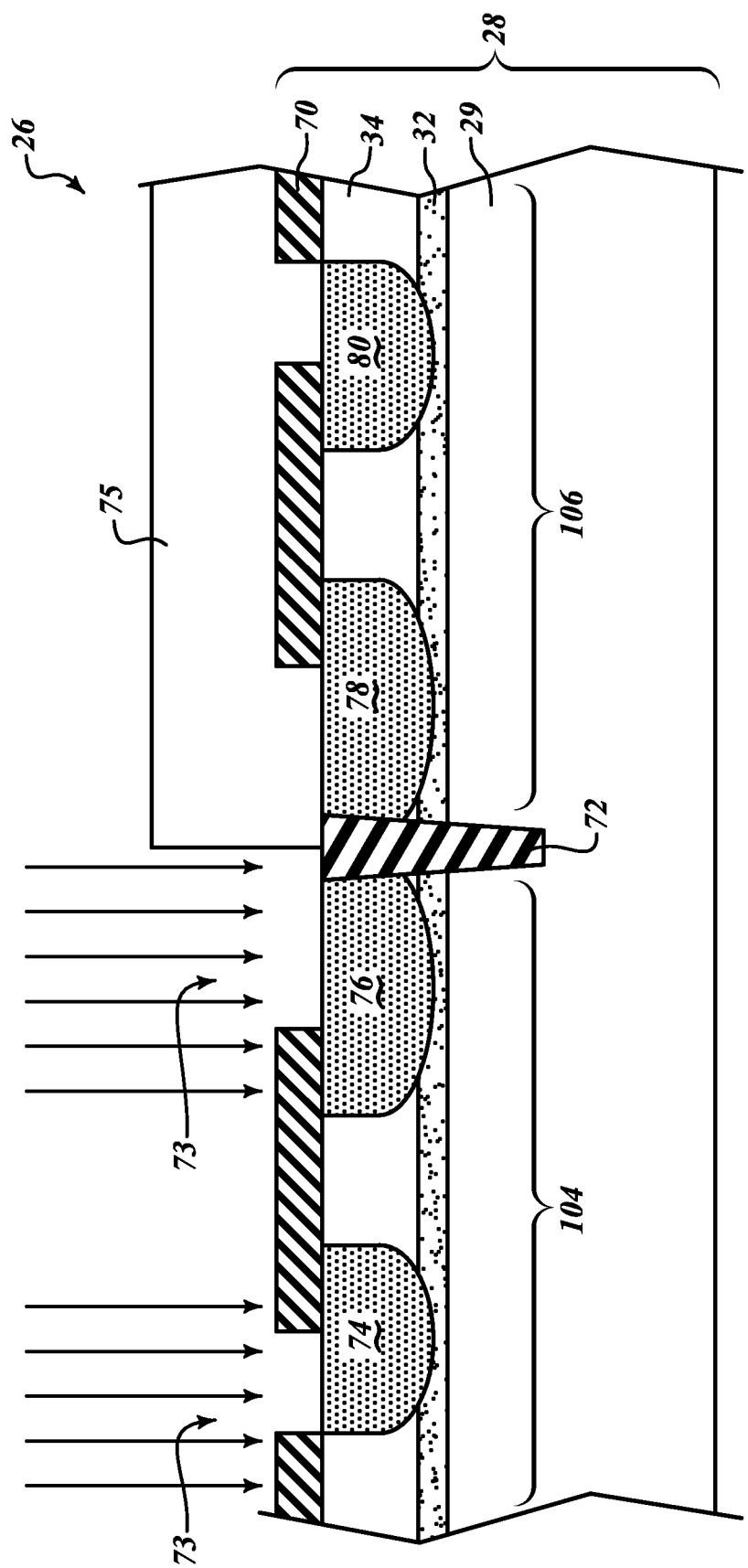

FIG. 2 illustrates a subsequent step in process in which sources and drains are formed within semiconductor device 26. Openings 73 are formed within hard mask 70 by depositing a layer of photoresist 75 over hard mask 70, developing the photoresist in the shape of the openings desired, removing the developed photoresist, and etching away portions of hard mask 70 in order to form openings 73.

Sources/drains 74, 76, 78, 80 are formed in the openings 73. Each of the regions 74-80 can be either a source or a drain, depending on the circuit connections and voltages applied thereto, therefore, each of these regions will be referred to as source/drain regions. In the example of FIGS. 2-9, an n-channel transistor will be formed in region 104 and a p-channel transistor will be formed in region 106. Of course, numerous n channel transistors can be formed adjacent to each other, as can p-channel transistors even though only one example of how each can be formed is provided herein. Source/drains 74, 76 are doped with elements from group V, such as arsenic and phosphorous, so as to be N-type semiconductor material.

The dopants may be implanted at a first angle which is approximately perpendicular to the plane of the surface of the semiconductor device. The dopant may also be implanted at a second angle into sources/drains 74, 76. The use of multiple angles to implant the dopant into sources/drains 74, 76 permits transistor characteristics to be custom designed for particular transistors to improve the depth and shape of the sources/drains 74, 76 as desired. Source/drain 76 is formed so as to abut directly against isolation 72, according to one embodiment of the invention.

Preferably, the region in which the channel transistors are to be formed has a mask 75 positioned thereover during the formation of the N-channel transistors 104. Accordingly, all the steps for forming the transistors in the N-channel region are carried out, after which the N-channel transistor regions are masked and then the subsequent steps for forming the P-channel transistors are carried out. Thus, while the later figures show the simultaneous formation of both the N-channel and P-channel transistors, in fact, preferably, they are formed sequentially, one after the other, with the N-channel transistors being completely formed while the area for the P-channel transistors is covered with a mask, and then the N-channel transistors are covered with a mask while all the steps are carried out from FIGS. 2-9 to form the P-channel transistors.

Sources/drains 78 and 80 are implanted with dopants from group III, such as boron, aluminum, or gallium in preparation for forming a p-channel transistor in region 106. The dopants to form source/drain regions 74-80 are implanted to a depth sufficient to enter separating layer 32. This will provide source/drain extensions as explained later herein.

According to one embodiment of the invention, sources/drains 78, 80 are implanted with the same dopants as sources/drains 74, 76 to form two adjacent N-channel transistors. According to another embodiment of the invention, sources/drains 78, 80 are implanted with dopants of a group that is different than the dopants used to implant sources/drains 74, 76. Accordingly, the sources/drains 74, 76 may be used to form an N-channel FET, whereas the sources/drains 78, 80 may be used to form a P-channel FET. Using multiple implant steps and angle implants results in a more precise halo and source/drain formation, according to various embodiments of the invention.

The type of dopants and the depth to which they are implanted is selectively formed based on the desired transistor characteristics. Preferably, multiple implants are done at various angles in order to form the device characteristics for the particular transistors. For example, in one embodiment, in the formation of the N-channel transistor 104, a P-type implant at a sufficient depth that it reaches the region 9 and extends partially into the silicon layer 29 is used to provide a halo implant in order to improve the transistor characteristics. The use of a halo implant of P-type doping material, such as boron, underneath and extending slightly into the channel beyond that of the source/drain region is well known in the art and numerous patents describe such a halo implant; see, for example, U.S. Pat. No. 5,894,158, incorporated herein by reference. There are numerous other techniques for forming such halo implants, well known to those of skill in the art and therefore not described herein in detail.

According to a first embodiment, care is taken to ensure that the dopant concentration throughout the source/drain regions 74, 76 are uniform throughout after the annealing step. According to this technique, the dopants are implanted with a range of energies with some high energy sufficient to place a first dopant implant in the upper region of layer 32, and subsequent implants at various depths within the source/drain regions 74, 76. The substrate is subsequently annealed in a heating step for only a brief time sufficient to activate the dopant but not to cause much movement of the dopant through diffusion, so that the shape and depth of the source/drain regions 74, 76 are based mostly on the implant energies used and the angles achieved. In such a situation, the dopant concentration can be made approximately uniform throughout the entire width and depth of source/drain regions 74, 76. In a second embodiment, which is often preferred, the implant energy places a majority of the dopants across the entire upper half and a central region in the lower half of the source/drain regions 74, 76. After this, the dopant is diffused and driven by a subsequent heating step of sufficient length to drive some of the dopants into the upper portion of layer 32. As the dopants are driven into the upper portion of layer 32, an automatic graded dopant profile will appear at the bottom corner regions of the source/drain regions 74, 76. This will result in an LDD-type source/drain region adjacent the channel in region 9, as will be explained later herein. In yet another embodiment, all dopants are implanted approximately vertically into the substrate at the openings so that the graded doping profile exists only laterally within the source/drain regions 74, 76 and a vertical, central region remains highly doped. This provides for the graded LDD implant at the edges of the source/drain regions 74, 76 while providing a higher doping concentration at the central region to provide improved transistor performance, as explained later herein.

One benefit of the present invention is that the implants for the source/drain regions can be made without concern for the short channel effects. As will be clear with respect to FIGS. 5-6 herein, the central region of the layer 34 between the source/drain regions 74, 76 will be removed in a later etch step. Therefore, the region at the surface of the layer 34 will be removed and therefore this technique avoids short channel effects and other problems associated with transistor formation of very small dimensions.

According to one embodiment, all doping for the transistors are done at this stage with the mask 70 in place. Namely, all halo implants, source/drain implants including formation of LDD junctions are done with a single mask 70 in place without the need for additional masks, sidewall growths, or other layers. This provides a low cost and tremendous benefit of forming the transistors with fewer masks and fewer process steps than required in many other transistor processes. In an alternative embodiment, described later herein with respect to FIG. 5, some additional doping may be done into the region 9 once it is exposed. However, this is an alternative embodiment and preferably all doping is carried out while the hard mask 70 is in place so that later doping of the source/drain regions is not needed.

Figure 3:
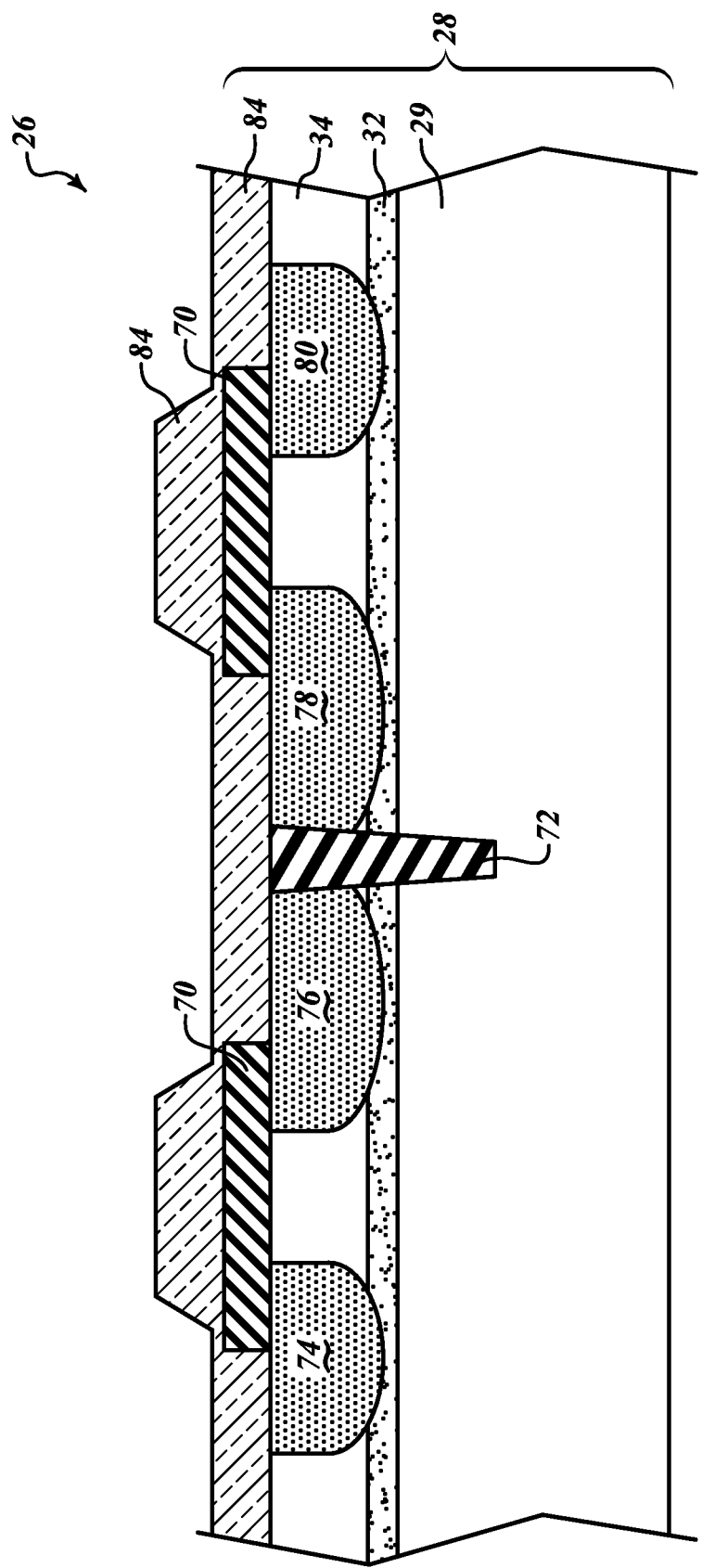

FIG. 3 illustrates a subsequent steps in the process in which a second hard mask layer 84 is formed over the wafer 28. The material for hard mask 84 is selected to permit layer 70 to be selectively etched relative to layer 84. The second hard mask 84 is used to facilitate the self-aligned formation of gate electrodes between sources/drains 74, 76 as well as between sources/drains 78, 80. After the second hard mask 84 is deposited, a chemical mechanical planarization (CMP) step is performed to reduce the second hard mask 84. In one embodiment, the material used to form hard mask 70 may be used as an end of etch indication layer for an etch being carried out of the second hard mask 84.

Figure 4:
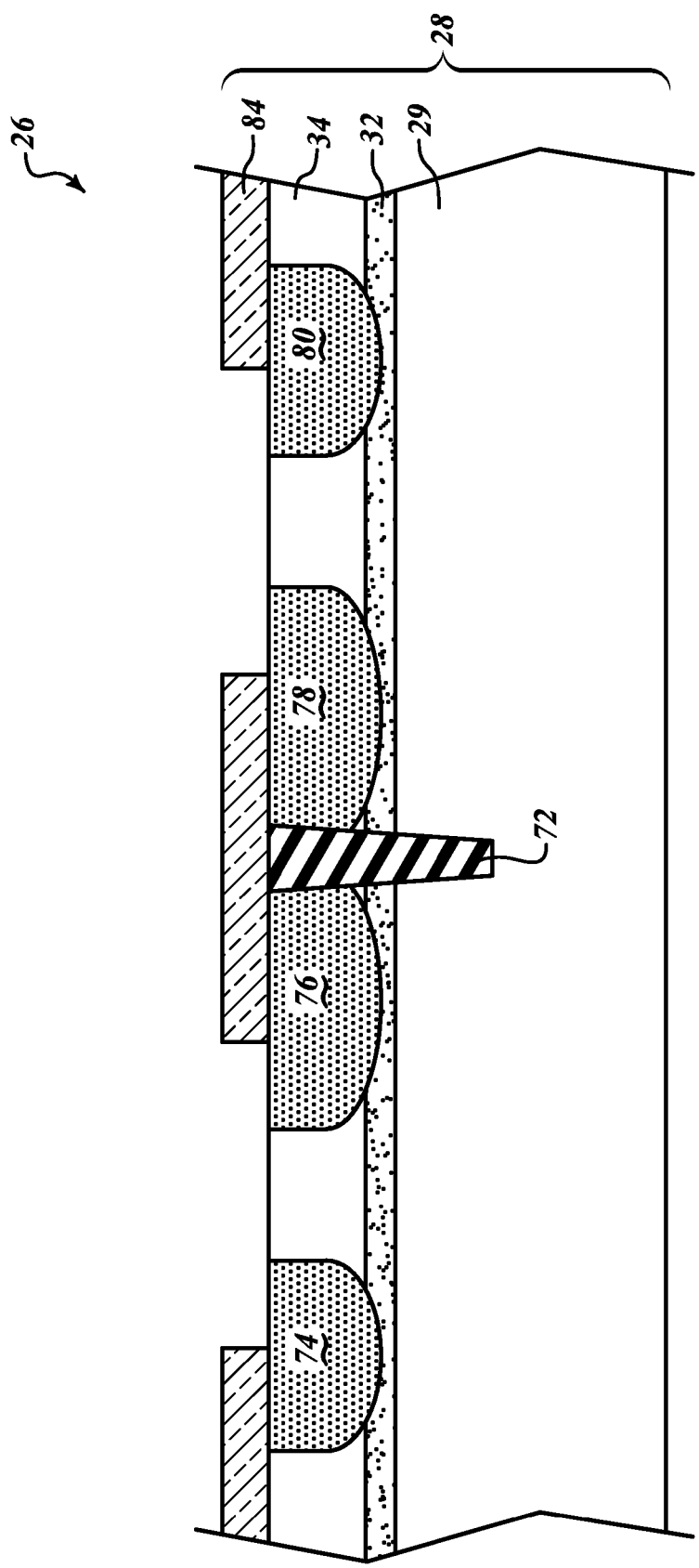

FIG. 4 illustrates a subsequent stage in the process in which hard mask 70 is removed and layer 84 remains over layer 34. This provides an opening in which the channel regions of transistors are formed in locations where it was removed, as explained later herein.

According to one embodiment, the mask for forming the channel region is the inverse of the mask used for the source/drain implants and a separate photolithographic step is not required. Therefore, the channel region will be automatically self aligned with respect to the source/drain regions. Specifically, the layer 70 is masked and etched in order to provide the location for the formation of the source/drain regions. The layer 70 is created by a photolithographic step. Subsequently, another material 84, such as silicon dioxide or other oxide, is deposited with the mask 70 in place. The material selected for the layer 84 is selectively etchable with respect to layer 70. After the layer 84 has been deposited, then a CMP is carried out in order to expose the layer 70 while maintaining the layer 84 on other portions of the wafer. Subsequently, the layer 70 is etched in all places where it remains on the substrate with an etch that is selective with respect to layer 84 so that layer 84 remains in all places where layer 70 was not present. Layer 84, therefore, forms the mask layer on the substrate that will provide the channel regions of the transistors as an inverse of layer 70. Accordingly, a separate photolithographic step for the channel is not required, thus saving the numerous process steps, time and expense that are required for a separate photolithographic step, photoresist deposition, processing and other steps. By using a hard mask and CMP to make an inverse of the source/drain mask, the benefits obtained are saving at least one photolithographic step and also automatically self aligning the source/drain regions to the channel region. Therefore, the use of the same photolithographic step for both the source and drain regions and the channel and then for the gate electrode formation assures perfect alignment between the gate electrode, the channel region and the source/drain regions, as well as saving numerous process steps.

Figure 5:
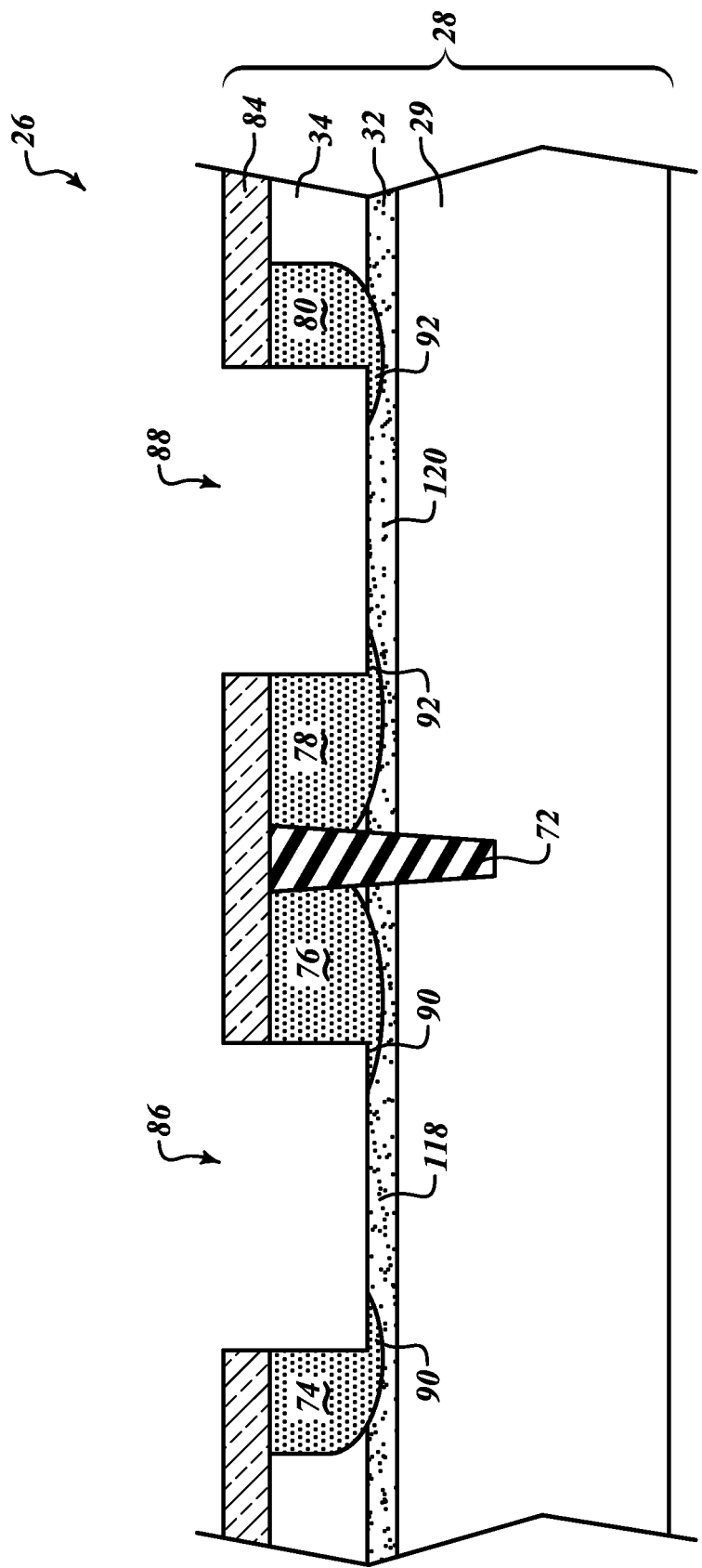

FIG. 5 illustrates the next sequential step in the process in which the layer 34 is etched with mask 84 acting as the layer to define the pattern for etching the openings through layer 34. The type of etch used is preferably one that is highly selective to silicon over SiGe so that the etch will automatically stop upon reaching the SiGe.

The etch process may be a dry etch or a wet etch to form openings 86, 88. Opening 86 is etched between sources/drains 74, 76, and opening 88 is etched between sources/drains rains 78, 80. According to one embodiment, the depth of the etch is determined by the separating layer 32. Separating layer 32 is silicon germanium, according to one embodiment. By using an etch that automatically stops on separating layer 32, the semiconductor device channels can be precisely formed at a selected depth between sources/drains 74, 76, 78, 80. The use of a different material for the channel than for the source/drain regions permits the depth of the etch to be ensured of stopping at the bottom of the source/drain regions and thus provide good control of the transistor properties.

A transistor formed according to these techniques will have the channel self-aligned with the source/drains. The inverse of the mask used to form the source/drain regions is used to form the channel regions without the need of a photolithographic step in between. By using a material for layers 70 and 84 which are selectively etchable relative to each other, the layer 70 can be removed following the deposition of layer 84 to expose the regions which will become the channel regions. The transistor locations can therefore be formed with more precision and as higher quality than would be possible if the channel and source/drains were not self-aligned with respect to each other.

The etch of the silicon layer 34 stops on the separating layer 32 to leave the previously implanted dopants in this layer 32. This provides extensions 90, 92 as conductive portions of sources/drains 74, 76, 78, 80 in the same layer that will become the channel. The depth and size of the extensions will be determined by the depth to which the dopants are implanted in the steps shown in FIG. 2 and the size of the windows opened in hard mask 70. Each transistor can be custom designed to have extensions 90, 92 of the desired depth and width by the selection of the implant and drive parameters during the process steps at FIG. 2 since an etch is used that automatically stops on separating layer 32 when etching layer 34. This permits precise and uniform formation of transistors. The formation of extensions 90, 92 as described herein, permits them to be accurately placed and the channel is self-aligned using the same mask as used to form the source/drain regions, thus providing precise control of these structures. This technique permits good control of the overlap capacitance as well as other transistor properties.

Specifically, as one example, regions 90, 92 can have a doping profile so as to provide LDD regions immediately adjacent the channel region which will be formed in layer 32. As previously described with respect to FIG. 2, when the doping of source/drain regions 74, 76 is carried out, a doping profile can be performed which has a lighter doping in the curved lower regions 90, 92 of the source/drain regions due to the natural doping profile that was obtained by diffusing the doping in the heating step. Alternatively, the implants 73 done at FIG. 2 can have a heavy dose in the central region and lighter doses at the edges or at angled implants to create a desired final doping profile of the region 90 in the final transistor after all heating steps. Thus, if the dopant is placed with a desired concentration in the regions of 74, 76 in the step of FIG. 2, and then driving by a heating step toward the outer edges, the region 90 will have the characteristics of an LDD implant without having to go through the additional processing steps of doing a first implant adjacent a gate electrode with no side wall formed and then forming a first sidewall and doing a second implant, then forming a second or third subsequent sidewall and doing additional implants. Thus, the prior art technique for forming LDD implants requires a series of different implants with different layers formed for masks and with different steps in the process with various layers grown and etched in between them. However, in the technique of this embodiment, such LDD source and drain regions 74, 76 can be easily formed using implants only at the stage of FIG. 2, as has been described herein.

In one alternative embodiment, a halo implant can be performed while the layer 32 is exposed as shown in FIG. 5. Namely, it may be desired at this stage to tailor the edges of the source/drain regions and the channel region by specific doping at this stage. It is possible to tune the electrical characteristics of the channel at this time to set the threshold exactly where desired. Further, it is possible to tune the exact extensions of the source/drain regions by performing specific doping or counter doping concentrations with the layer 84 in place and with the channel region of layer 32 exposed. Preferably, doping is done at this stage without an additional mask present so that any doping carried out in to the channel region 9 also enters into the exposed portions of the source/drain regions. Therefore, some care will be taken as to which doping is carried out at this stage since doping of the channel region will also have some effect on the regions of the source/drain regions immediately adjacent the channel.

According to one embodiment, the effect of an LDD implant is easily achieved at this stage of the process as shown in FIG. 5. Specifically, the channel 9 is exposed and doped lightly with a P-type material such as boron in order to tune the channel to desired threshold characteristics. The boron will also enter into the edges of the source/drain regions 74, 76 and have the effect of reducing the dopant concentration of the N-type material immediately at the edges, thus, creating the effect of an LDD implant immediately adjacent the channel region. Thus, the P-type doping into the main channel region will also have the benefit of improving the LDD characteristics of the source/drain regions immediately adjacent the channel region where it is most desired. A subsequent heating step will be very brief in order to activate the dopant to keep any implants done at this stage from diffusing beyond the desired location.

According to one alternative embodiment, at this stage it is also possible to epitaxially grow an additional layer on top of the SiGe layer 32, which includes additional materials. At the stage FIG. 7 in of the process, the SiGe layer is exposed and no silicon as exposed as a horizontal surface. A new layer containing additional custom elements, such as carbon and an SiGe layer can be epitaxially grown in order to customize the channel properties either at the stage shown for FIG. 5 or at FIG. 7. According to one embodiment, on top of layer 32, while it is exposed as shown in wafer 28, an additional thickness of SiGe is grown with a slight increase in the percentage of germanium and also having carbon therein in order to customize the channel characteristics.

Figure 15A:
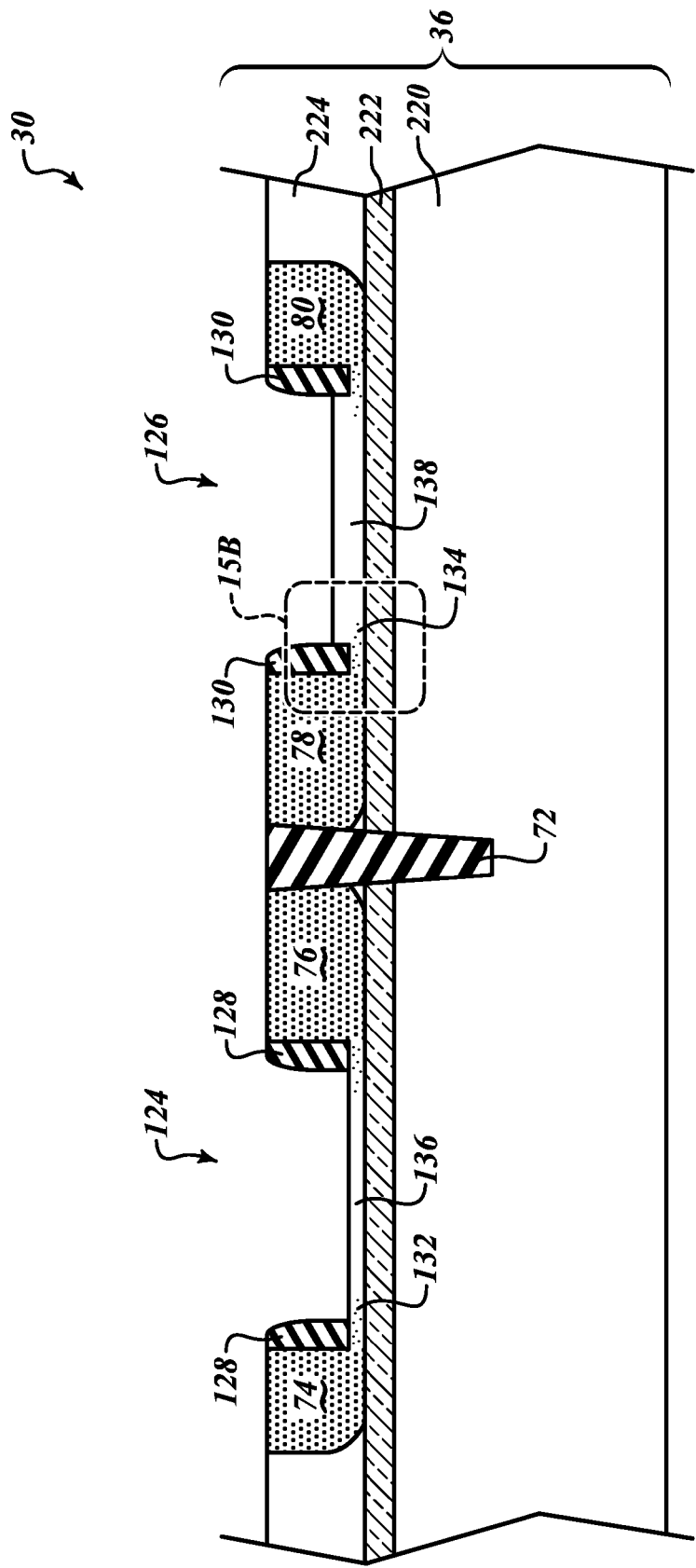

It is also possible to grow the channel region thicker in one transistor only, for example, the P-channel, to improve carrier mobility, while leaving a mask on the other transistors. One example of this is shown in FIG. 15A.

Figure 6:
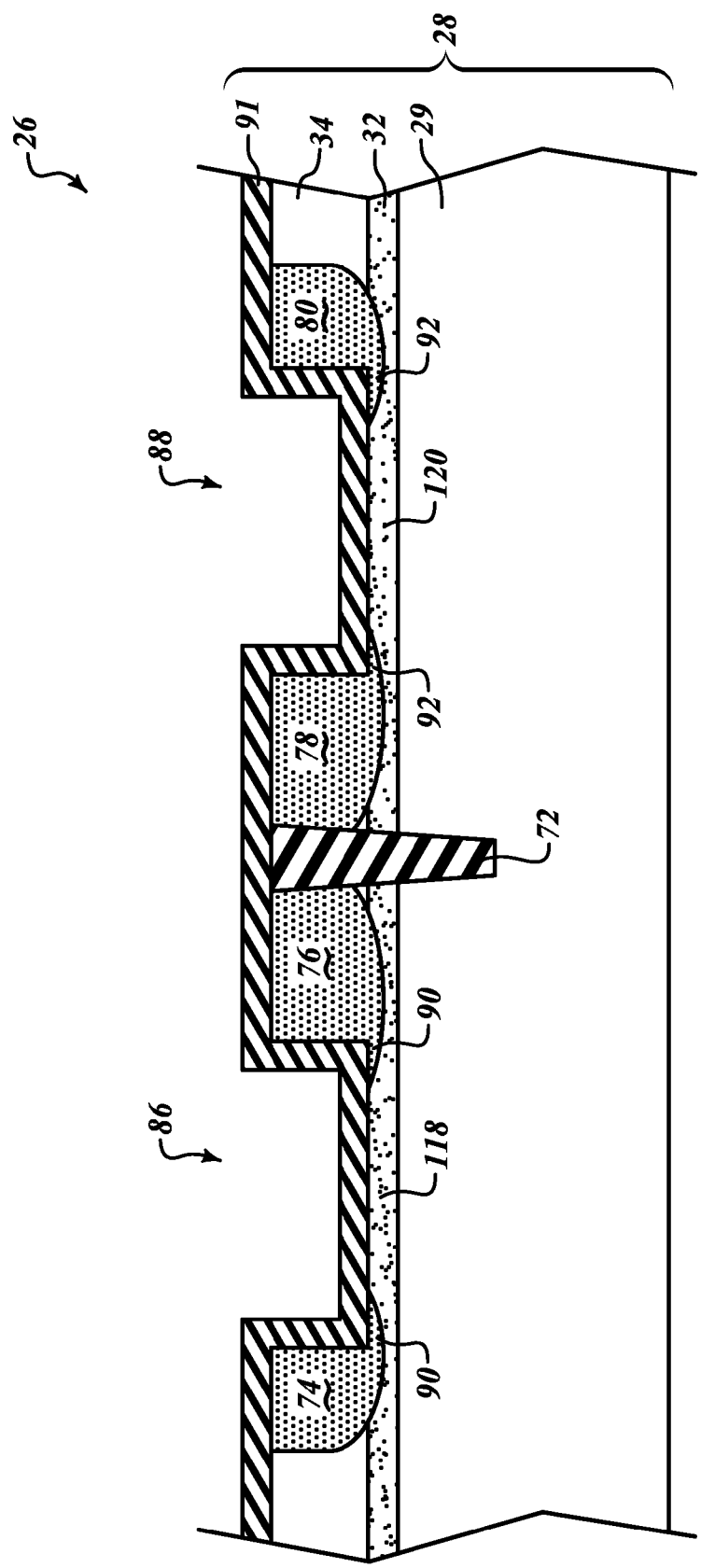

FIG. 6 illustrates subsequent steps in the process in which a layer 91 is formed to be a spacer layer. First, the hard mask 84 is removed by an acceptable process, such as a wet etch, CMP, ion etch other acceptable process. In some instances, the trench isolation 72 might be etched by the same etch that removes layer 84, in which case, an etch stop under layer may be used on top of the trench isolation layer 72, beneath the second hard mask 84 in order to prevent trench isolation 72 from recessing during the etch process of mask 84.

The spacer layer 91 is formed by deposition silicon nitride in a blanket deposition over the entire wafer, according to one embodiment. The spacer layer 91 is a conformal deposition on the side walls and floors of openings 86, 88.

Figure 7:
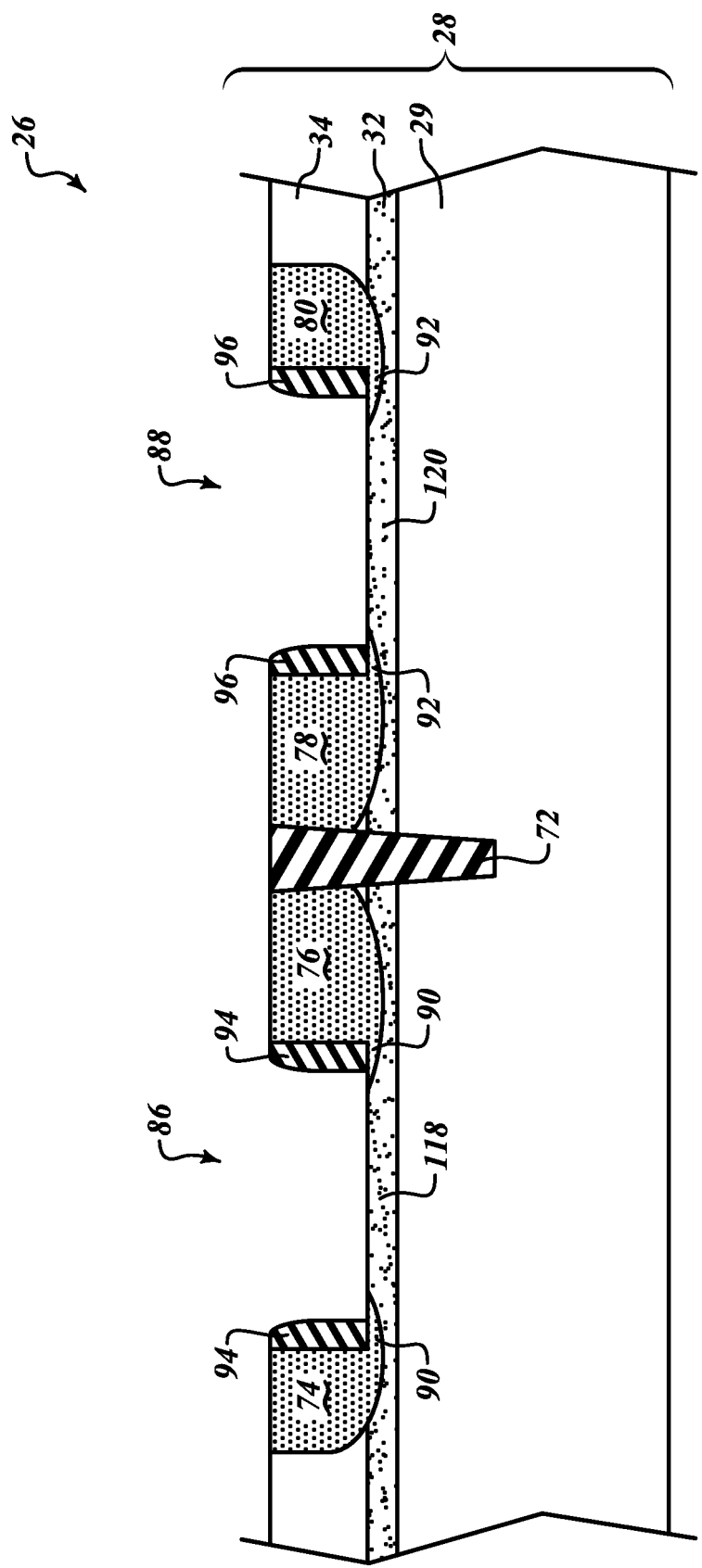

FIG. 7 illustrates a process of forming spacer sidewalls 94 and 96 on semiconductor device 26, according to one embodiment. The spacer layer 91 is etched away by a vertical isotropic etch to depth sufficient to remove all horizontal portions of spacer layer 91 and leave sidewalls 94 and 96 in the openings 86 and 88. Fluorocarbon ($C_4F_8/Ar/N_2$) etch may be used to increase the selectivity between the germanium of separating layer 32 and the silicon of silicon layers 29 and 34. Similar to the process illustrated in FIG. 5, the SiGe separating layer 32 may be used as the end point stop indication layer for the etching process. When the process of etching detects that SiGe has been reached, the etching is terminated. In some embodiments, the etching continues for specific timed period to be assured of properly clearing the spacer layer 91 from the bottom the openings 86 and 88. According to one embodiment, a thin etch stop layer may be used present above the SiGe layer for stopping the spacer on the channel. The layer 91 is preferably made from a material which has high etch selectivity relative to the separating layer 32 to ensure the etching properly stops without removal of significant channel material.

The thickness of the layer 91 will determine the channel length as will now be explained in conjunction with FIGS. 6 and 7. As can be seen by the sidewalls 94 in FIG. 7, the remaining width of the sidewalls 94 corresponds approximately to the thickness of the layer 91 which was grown in FIG. 6, as previously described. The distance between the layers 94 will become the channel length. Accordingly, if a thicker layer 91 is formed then the distance of the channel length will become correspondingly smaller. Layer 91 can be deposited with high precision to a desired thickness. The use of the deposition of a layer 91 to determine the channel length provides the benefit that the channel length can be more narrow than the most narrow photolithographic line which can be formed on the wafer 28 using the most advanced photolithographic equipment then available. For example, if the photolithographic techniques available permit proper formation and alignment of 45 nm to be formed, the opening 86 will be in the range of approximately 45 nm wide. According to current technology, this line width would be the smallest gate electrode that can be formed and, therefore, will be the smallest channel length that can be formed in a transistor for that particular process technology. The present invention, however, is able to achieve a channel length substantially smaller than the photolithographic line width by use of the layer 91 which is deposited into the opening 86 which has been formed by a photolithographic mask. For example, if the mask opening 86 is approximately 45 nm and the layer 91 is grown to approximately 10 nm in thickness, then the sidewalls 94 will be 10 nm thick on each side for a total of 20 nm of thickness resulting in a channel length of approximately 15 nm. This channel length of 15 nm was achieved without the use of a separate mask in order to form the gate electrode of the channel. Further, the layer 32 can be grown with more precision and thickness at very small dimension than photoresist can be patterned and etched at very small photolithographic line widths. Accordingly, the channel length would be defined by the thickness of the layer 91 rather than the particular etch processes and photolithographic tools which are available. The channel length can therefore be made as narrow or as wide as desired.

According to one embodiment, the layer 91 is relatively thin, in the range of 1-2 nm so that if the opening 86 is approximately 32 nm, that the channel length would be in the range of 26-28 nm. Alternatively, layer 91 is approximately half the thickness of the opening 86. For example, if the opening 86 is approximately 45 nm, the layer 91 can be grown to approximately 20 nm, so that each of the sidewalls 94 extend about 20 nm into the opening 86 leaving an opening for the channel regions 118, 120 of approximately 5 nm. Alternatively, if the opening 80 is 32 nm, the layer 90 can be grown to 15 nm, leaving a channel length of 2 nm. Looking back at FIG. 2, when the hard mask 70 is formed and the line widths are etched to leave the hard mask 70 desired locations the minimum geometries available in that particular process will normally be used to form respective remaining portions of hard mask 70. No subsequent photolithographic steps, photoresists or exposures will be required through the remainder of the formation of the channel region and the gate electrode. Accordingly, the length and location for the channel will be set with the formation of mask 70 and then the subsequent deposition and etching of layer 84 will open the apertures to expose the channel regions 118, 120 and the layer 32 will be deposited to a thickness in order to set the channel length to the desired custom length. All of this is carried out based on the single photolithographic step at the formation of layer 70.

The doping concentration, doping profile, angle implants and diffusions of the source/drain regions 74, 76 will be carried out in anticipation of the end desired channel length. As can be seen in FIG. 2, the source/drain regions 74, 76 are implanted and driven to a substantial distance underneath the hard mask 70. This can be achieved by the appropriate angle implants followed by the appropriate heating steps for a sufficient period of time in order to diffuse the source/drain dopants vertically to the layer 32 and also laterally to encroach under the layer 70 in the silicon layer 34 a desired distance. Thus, the regions 74, 76 will be formed to be as close to each other as needed for the subsequent channel length that will be custom formed as shown in FIG. 7. If the final channel length desired is 5 nm, then layers 74, 76 will be implanted and diffused to be less than 5 nm from each other, for example in the region of 2-3 nm. Since the central region will be etched away, the doping profile is made from the regions 74, 76 can overlap at their upper region and customized to leave an area in layer 32 in which the source and drain regions do not touch each other and are separated by a distance equal to the desired length of the final channel region. Thus, the dopant implant energy and subsequent diffusion steps are carried out in FIG. 2 in order to achieve a final channel region that is planned as shown in FIG. 7 herein.

Normal process technology does not permit a channel to be formed in such a wide range of lengths, such as 2-50 nm using a single process technology. One benefit of the embodiments of the present invention is that a single process technology may be used to easily form relatively long channels in the range of 50 nm and greater as well as deep channels that have a thick layer 32 and other properties. Alternatively, a shallow channel can be formed by having a thin layer 32 together with a relatively short channel by use of a thick layer 91 so the sidewalls 94 are relatively close to each other having a spacing in the range of 2-5 nm from each other after the etching step is shown in FIG. 7. As previously mentioned, the regions 90 will be tailored to extend slightly under the final sidewalls 94 after all etching has taken place and just prior to the deposition of the gate dielectric and the gate electrode, as will now be explained.

Figure 8A:
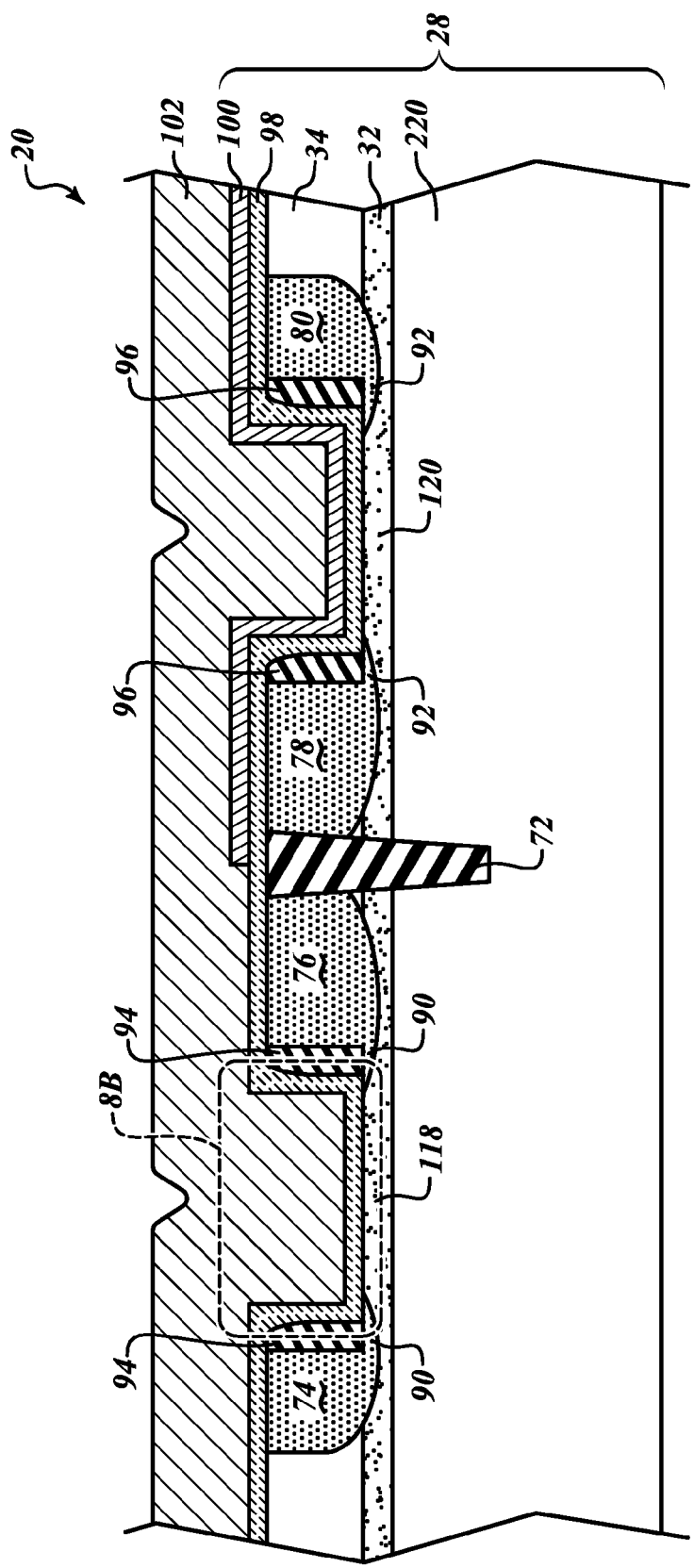

FIG. 8A illustrates a process of depositing a gate insulator as high dielectric constant (high K) layer 98 and metal gate stack film 102, according to an embodiment of the invention. The layer 98 is preferably conformally deposited over the wafer 28 along the side walls and bottom of openings 86 and 88 to a selected thickness. Preferably, the gate dielectric 98 is Hafnium oxide, HfO2. HfO2 has a high dielectric constant for a gate insulator and can be formed 6-20 Å in thickness and is suitable for making gate lengths in the range of 1-50 nm and within the preferred range of 3-20 nm. Accordingly, use of HfO2 for the gate dielectric permits the channel regions to be formed in the entire range of 2-50 nm.

As shown in FIG. 8B, subsequent to the deposition of the gate dielectric, a gate electrode 102 is deposited in various layers. For an N-type transistor, the gate electrode has a work function for N-type material in a series of layers. A first layer 99 is preferably titanium nitride, TiN, followed by a second layer 101 of tantalum nitride, TaN. On top of this is deposited a particular work function layer 103 for N-channel devices, such as titanium aluminum, TiAl. On top of this is deposited a metal gate layer 105 to complete filling the gate electrode 102 and completely fill the aperture 86 between the sidewalls 94. The gate layer can be aluminum, tungsten, copper or polysilicon. Currently tungsten or copper are preferred. In summary, for an N-channel transistor the preferred layers of deposition for the gate electrode 102 include a dielectric cap layer 99 of TiN, followed by a sealing layer 101 of TaN, followed by an N-function layer 103 of TiAl. Each of these layers is relatively thin, being in the range from 3-10 Å each. Preferably, the work function layer of TiAl is approximately twice as thick as the cap layer of TiN and the barrier layer of TaN. Namely, if the first two layers are in the range of 3-5 Å in thickness, the TiAl layer would be in the range of 10-12 Å. The remainder of the gate electrode is formed preferably a metal, such as aluminum, although in some embodiments the gate electrode may be formed of copper with the appropriate sealing layers of tantalum nitride, and the like to provide a proper seal between the copper and the substrate layers 29.

When forming the P-channel transistor 106 an additional P-work function layer 100 is added between layers 101 and 103 in order to customize the operation of the P-channel transistors. Preferably, the P-work function material is a relatively thick layer 100 of TiN having a thickness approximately three times the thickness of the first cap layer 99 of TiN and approximately double the thickness of the TiAl layer 103 which is used as the work function layer for the N-channel transistors.

According to one embodiment, these same two layers 99 and 101 are used in both the P-channel and N-channel transistors for the first two layers, namely TiN and TaN, and then a custom deposition is made into the P-channel transistors of a P-work function material layer 100 of TiN to a desired thickness, for example, 30-50 Å or greater, after which a blanket TiAl layer 103 is deposited for both the N-channel and the P-channel transistors in order to complete the work function layer for the N-channel transistors and provide an additional layer in the P-channel resistors. Thus, in one embodiment, the work function layers for the N-channel transistor are also provided in the P-channel transistor. However, an additional layer 100 is provided in the P-channel transistors in order to customize the work function of the gate for the P-channel transistors.

A metal layer 105 is blanket deposited in method that will substantially fill the openings 86 and 88. A more planar deposition process is preferred to a conformal process to ensure that the openings 86 and 88 are filled with metal to above the top of the silicon layer 34.

Figure 9:
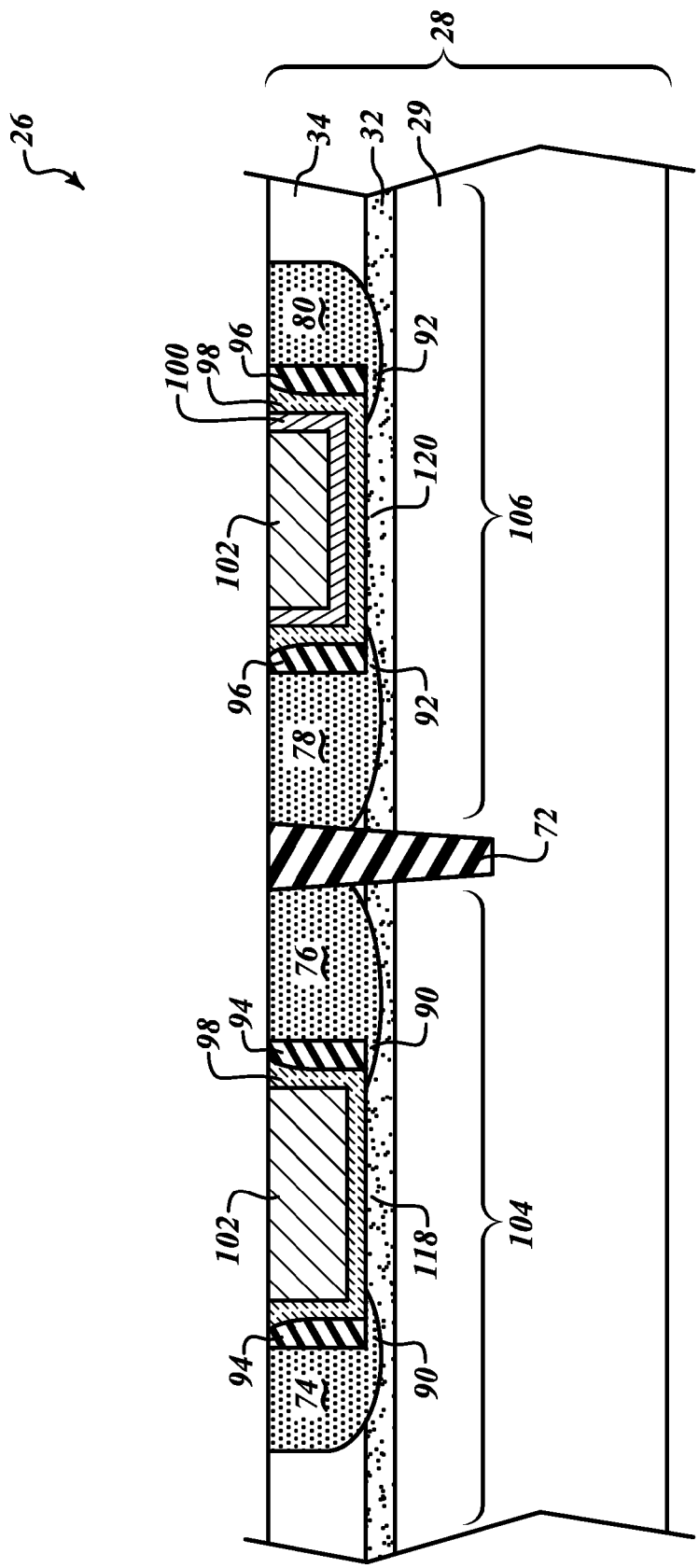

FIG. 9 illustrates semiconductor device 26 including FETs 104 and 106 formed within wafer 28 after performing a CMP of high K dielectric layer 98, additional layer 100, and metal gate stack 102.

FET 104 includes a metal gate electrode 102, a dielectric 98, spacers 94, source/drains 74 and 76, and a SiGe channel 118 formed between heavily doped extensions 90.

Similarly, FET 106 includes a metal gate electrode 102, a dielectric 98, spacers 96, source/drains 78 and 80, and a SiGe channel 120 that is formed between heavily doped extensions 92. While the additional work function layer 100 is shown below gate 102, it will preferably be a sandwich layer as described to facilitate the operation of a p-channel FET if desired.

These recessed-gate FETS 104 and 106 include several features that make them capable of being fabricated in sub-32 nm processes, preferably in sub-22 nm processes. For example, the recessed gate electrode has a low sheet resistance. The source/drain junction regions and source/drain extensions 90 and 92 are shallow to avoid undesirable short channel effects and roll-off on the threshold voltage at short channel lengths. This recessed gate electrode can continue to shrink while maintaining low gate electrode resistance, low junction depth, and low junction capacitance by combining the advantages of raised source/drains and by replacing metal gate electrode and silicon on insulator (SOI) with few process steps.

Semiconductor processes that are 32 nm and smaller utilize metal for gate electrode formation, in spite of the increase in cost over polysilicon, because polysilicon gate electrodes lead to undesirably high contact resistances. Thus, gates 102 are formed of metal in a first embodiment. In one embodiment, the gate electrodes are formed of aluminum. In another embodiment, the gate electrodes are formed of gold. However, according to another embodiment, gate electrodes 102 are formed of a non-metallic material, such as polysilicon. For extremely narrow openings, conformal deposition of aluminum can be difficult to achieve. Accordingly, in some embodiments the material which fills the middle of the gate electrode can be an additional conductor which can be assured of filling the narrow channel region over which the gate electrode is positioned without leaving keyholes. This, for example, can be tungsten, copper or any other suitable conductor. In one alternative embodiment, a layer of TiAl is deposited sufficiently thick to approximately fill the opening and provide the conductive properties for the gate operation. The central region of the gate can be left void of a metal or a conductor and subsequently filled with a dielectric, if desired. Since a metal is used for at least three of the layers inside of the gate electrode, the central region has a slight void, and is still significantly more conductive than a polysilicon gate.

As can be seen by viewing FIGS. 1-9, a transistor has been formed in which each of the main lateral elements the source, the drain and the channel have a dimension that is smaller than the minimum dimension that can be formed with the photolithographic equipment. While the source/drains are initially made with the minimum line width, the gate electrode facing portions of each are etched away and replaced with a channel region, whose length will be less than the minimum dimension as well because of the sidewall formation. Thus, the entire transistor now has each of the features in the final transistor with a lateral length, in the same dimension as the channel length, which is smaller than the opening in the mask used to form that feature based on the steps carried out. In the example shown, the width of two features in a first photolithographic step, the source and the drain, are used to create three features, the source, drain and channel, with etching performed at various times without another photolithographic step so that two initial regions are used to make three distinct structures, and the transistor as a whole, including the source, drain and channel, is now at least ⅓ smaller than has been achieved in the prior art.

FIGS. 10 through 17 illustrate a process of fabricating an inventive semiconductor device 30, according to a second embodiment of the invention.

Figure 10:
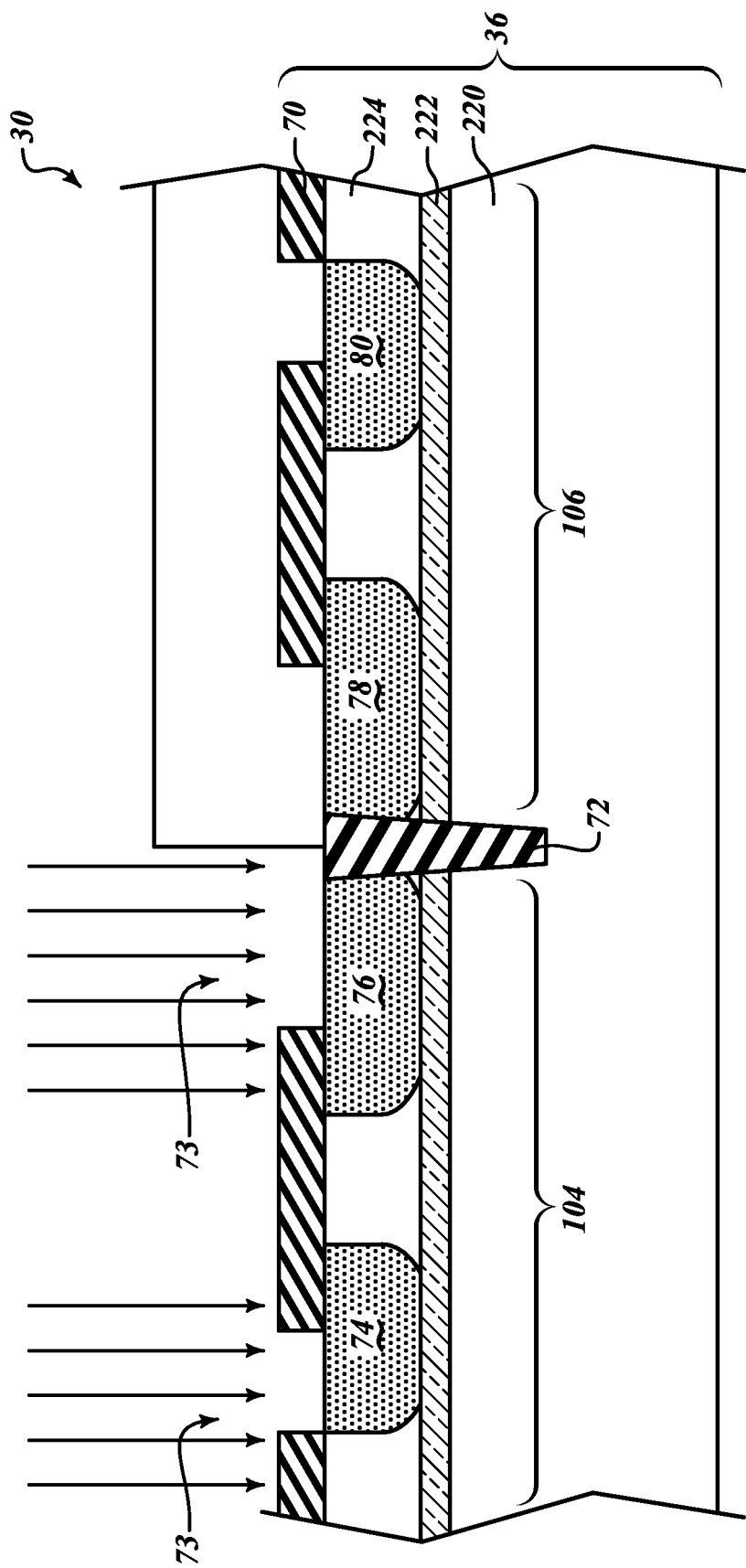
FIGS. 10-17 illustrate a process for forming an inventive semiconductor device according to a second embodiment.

FIG. 10 illustrates an inventive semiconductor device 30 formed with a separating layer 222 that comprises buried oxide (BOx) or silicon dioxide ($SiO_2$) instead of SiGe, according to an embodiment of the invention. According to this embodiment, a wafer 36 is provided as a silicon insulator wafer having a monocrystalline silicon region 220 with a buried oxide 222 on the top of, and a monocrystalline silicon layer 224 overlying, the buried oxide layer. The buried oxide layer 222 can be formed by any acceptable techniques of which many are known in the art. Subsequently, a hard mask 70 is formed over the layer 224 as previously described with respect to FIG. 2, and dopants are implanted into the source/drain regions 74, 76, 78, 80, as previously described. In the particular embodiment in which layer 222 is a buried oxide, the dopants will not enter the layer 222, but rather will be stopped at the interface between the monocrystalline silicon layer 224 and the a buried oxide layer 222. Accordingly, the depth to which the dopants are implanted and subsequently diffused in order to reach a particular depth inside layer 222 is not necessary. This provides greater flexibility in the different implant energies that can be used for the different dopants implanted into the source/drain regions, and also the heating steps that are carried out to diffuse the dopants afterward. Thus, this has some advantages in that the exact depth of the source/drain regions can be set based on the thickness of the layer 224 rather than the implant energies and drive times during the diffusion heating steps.

Figure 11:
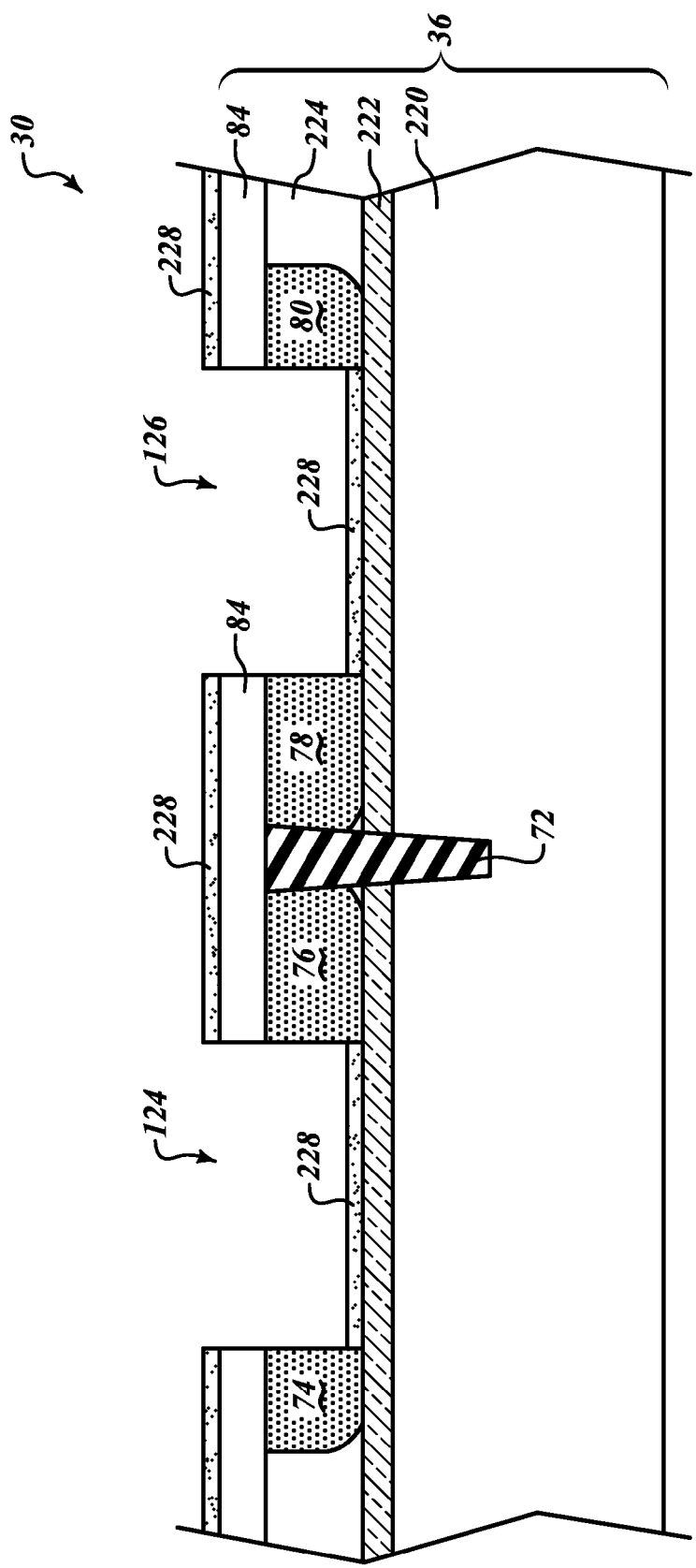

Following the formation of the source/drain regions 74, 76, 78, 80 using the techniques described with respect to FIGS. 2-5 herein, a layer 84 is formed on the upper surface 224, as shown in FIG. 11. Also shown in FIG. 11 is the formation of the horizontal layer 228 which is formed only on the horizontal surfaces of the exposed wafer 36. The layer 228 is formed as an anisotropic deposition of a thin film that forms on the horizontal surfaces only and not on the vertical surfaces. For example, a thin film HDP deposition of a low density oxide can be formed on the horizontal surfaces only of the wafer 36, which results in a thin layer 228, as shown in FIG. 11. The material selected for the layer 228 is preferably selectively etchable with respect to the material that will be used for the sidewall spacer layer 91 to be introduced later. If the sidewall layer 91 is made of a high density oxide, then a low density HDP oxide is acceptable for the layer 228. Alternatively, if the layer 91 is made of a nitride or other material, then the appropriate oxide may be used for layer 228, deposited as a thin film as an anisotropic deposition.

Preferably, the layer 228 is relatively thin, in the range of 10-50 Å. In some embodiments, the layer 228 may be as thick as 100-200 Å; however, generally a layer having a thickness in the range of 30-50 Å is preferred. There are many well-known techniques to form a thin layer 228 on the horizontal surfaces only, and thus the details of doing so are not described.

Figure 12:
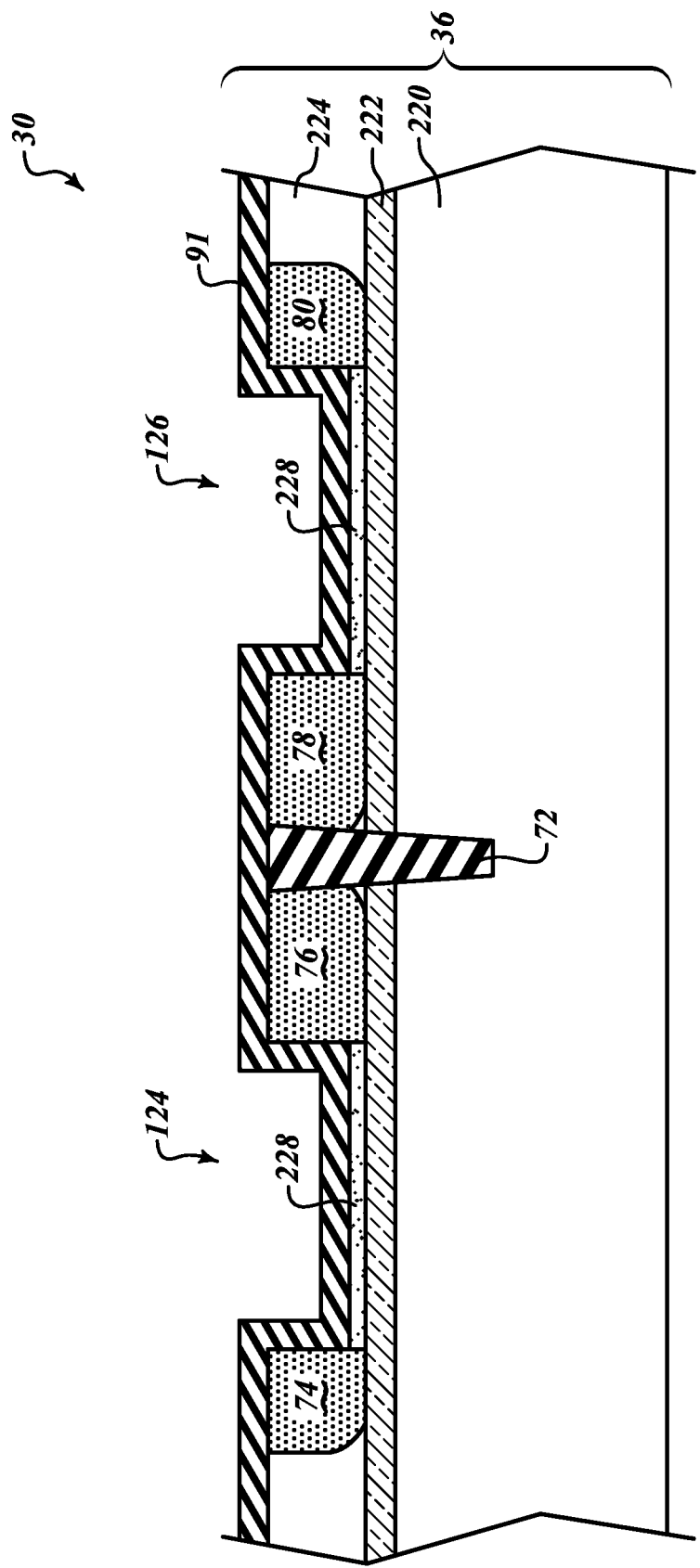

FIG. 12 illustrates a spacer layer 91 deposited on top of the exposed wafer 36 and overlying the layer 228 within the openings 124, 126. When the layer 227 is removed, a portion of layer 228 on the top of it is removed, leaving layer 228 only in the trench regions 124, 126.

The spacer layer 91 is deposited over silicon layer 224 and into openings 124 and 126 after the gate etch, as shown in the prior figures. A bromine etch may be used to increase the selectivity between the silicon and BOx or SiO$_2$. The spacer layer 91 coats the sidewalls and overlies layer 228 on the floors of openings 124 and 126. The spacer layer 91 is formed with silicon nitride, according to one embodiment.

Figure 13:
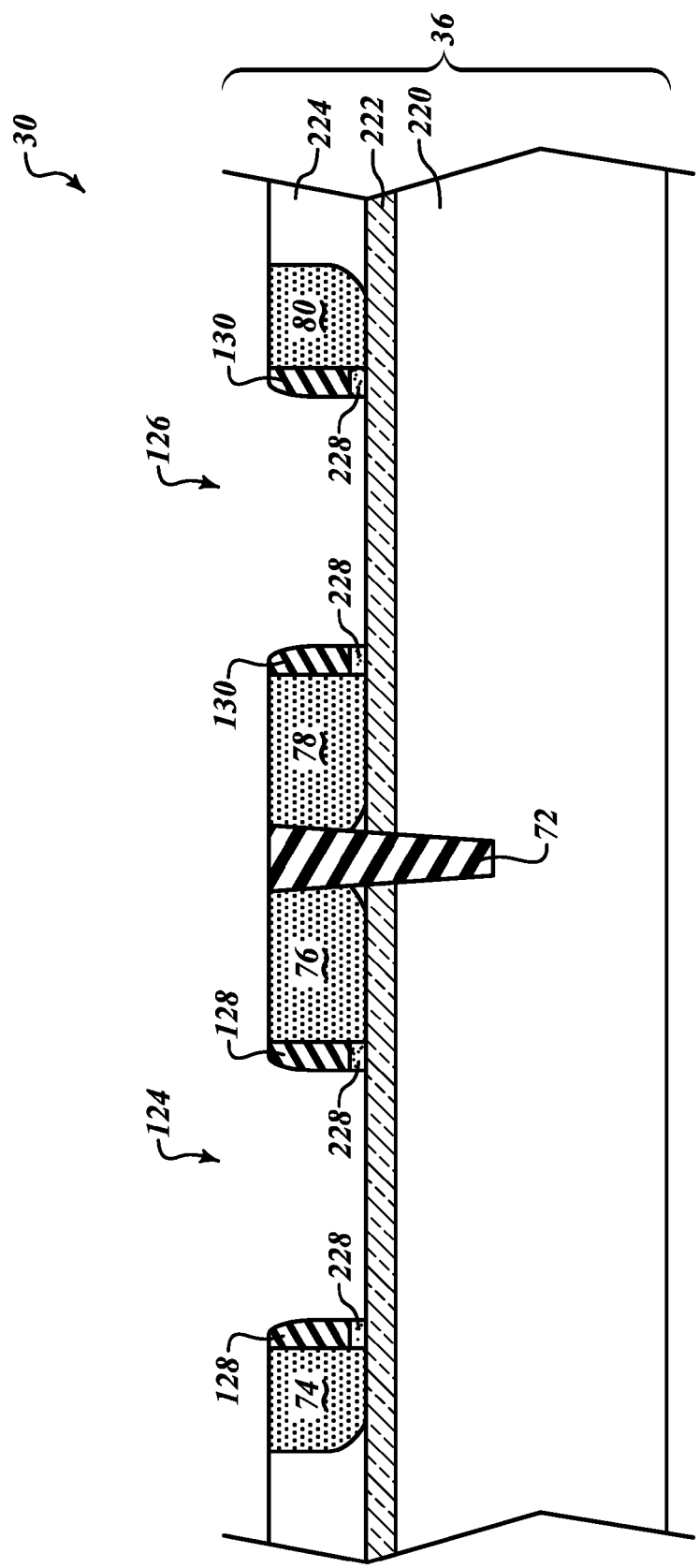

FIG. 13 illustrates a process of forming spacer sidewalls 128 and 130 on semiconductor device 30, according to one embodiment. The spacer layer 91 is etched away to remove all of spacer layer 91 except for sidewalls 128 and 130 and the layer 228 where it is not protected by the sidewalls 128 and 130. The BOx or SiO$_2$ separating layer 222 is used as the stop layer for the etching process. FIG. 13 illustrates the wafer 36 after the sidewalls 128 and 130 have been formed. As can be seen, a small portion 228 will be underneath the sidewalls 128 separating the sidewalls from the barrier oxide layer 222. The layer 228 will extend all the way underneath the sidewall 128 and abut against the monocrystalline layer 224.

Figure 14:
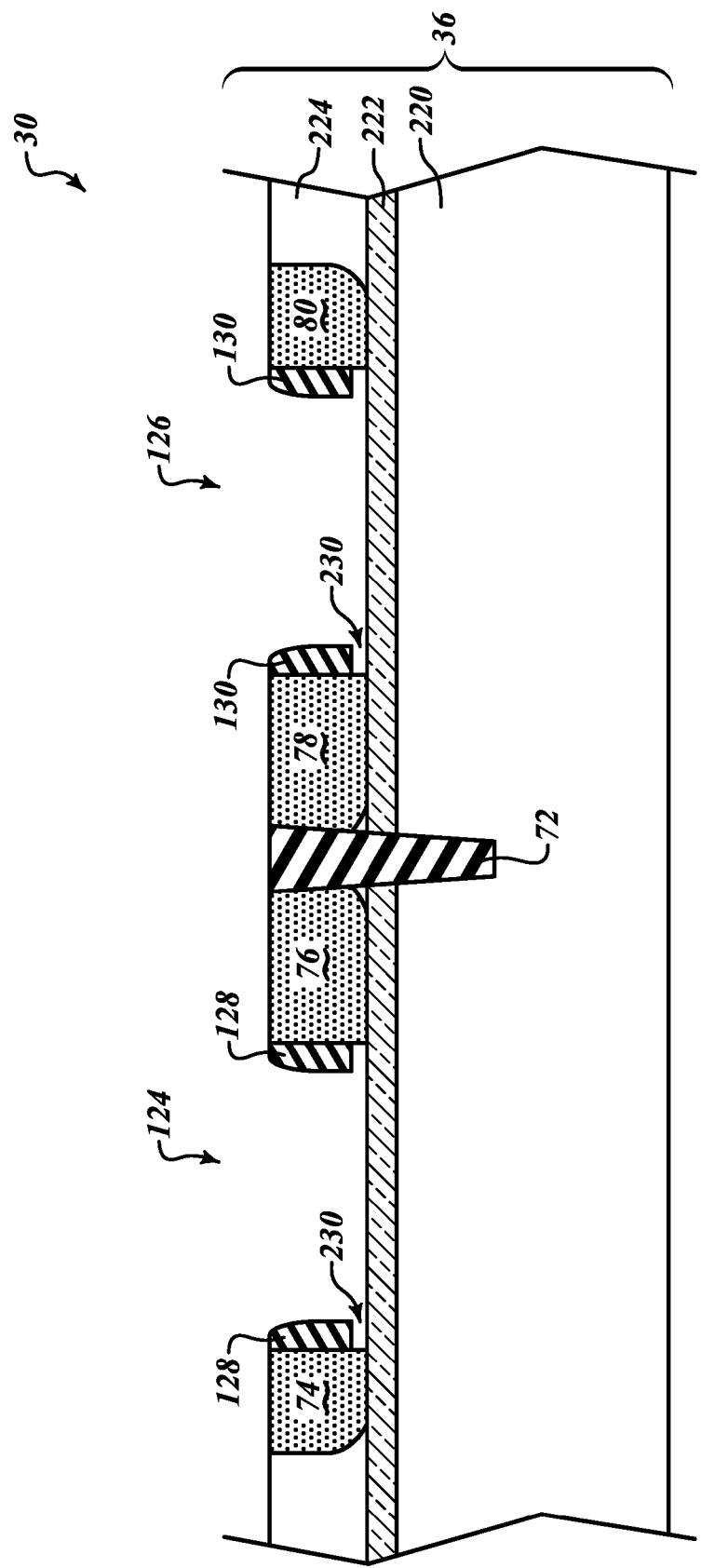

As shown in FIG. 14, the layer 228 is then etched with a selective etch to open up a hole 230 that exposes the monocrystalline layer 224 that is part of the source/drain region 74, 76. The etch chemistry can be changed after layer 91 is etched to remove all of layer 228 in one step, if desired. Thus, the bottom region of the trench 124 has an oxide layer 222 on the bottom and exposed sidewalls, just above the oxide layer 222 of monocrystalline silicon region 224, as shown in FIG. 14. The material for the layer 228 is, therefore, chosen to be selectively etchable with respect to layer 91 to ensure that it can be removed underneath sidewalls 128 without removal of the sidewall material, as shown in FIG. 14.

FIGS. 15A-15B show the subsequent growth of an epitaxial layer of monocrystalline that will form a channel region 136 of the N-channel transistors and 138 of the P-channel transistors.

FIG. 15A illustrates a process of forming epitaxial (epi) layers to form gate electrode channels for semiconductor device 30. Channel 136 and channel 138 may be grown simultaneously, or they may be grown at separate times of silicon that is doped differently in situ as grown so that channel 136 will operate differently than channel 138. For example, channel 136 may be doped as P-type silicon to form the channel of an N-channel FET, and channel 138 may be doped as N-type silicon to form the channel of a P-channel FET, or vice-versa.

When the channel region 136 is grown, a slow epitaxial growth process is carried out to permit the single crystalline lattice structure of layer 224 to provide the seed formation for the channel region as it grows laterally away from the sidewalls of the layer 224. By slow and careful controlled growth of the epitaxial layer, the same single crystalline structure of layer 224 can be continued with an epitaxial growth across the entire region that will become the channel region 136. The layer is grown to a desired thickness to equal exactly the desired depth of the channel region. Thus, a very shallow channel can be grown with the epitaxial growth in the range of 10-50 Å, as desired. Alternatively, a thicker channel region can be grown, thicker than 100 Å, if desired for increased current carrying capabilities.

As previously stated with respect to FIGS. 6-7, the thickness of the sidewall oxide 128 is selected to provide a desired channel length and the thickness of layer 228 is selected to provide a desired channel height. In one embodiment, the length of the channel 136 will be in the range of 10-15 nm. Accordingly, providing an epitaxial growth away from the sidewalls of the monocrystalline silicon layer 34 of approximately 5 nm from each side can be easily achieved using the proper temperature and slow growth techniques of the epitaxial silicon on top of the barrier oxide layer 222. If the channel length were extremely long, for example in excess of 50 nm, it might be that some central portion of the channel region would remain polycrystalline silicon rather than be formed as a monocrystalline silicon as it grows out from the layer 224. However, since the preferred channel length is quite small, preferably less than 30 nm and some embodiments in the range of 5-15 nm, the layer will be single crystalline silicon so that the channel remains single crystalline silicon as epitaxially grown from the sidewalls using the opening under the sidewall spacer 128. Of course, the thickness of the previously deposited layer 228 is selected to be sufficiently thick to provide sufficient surface area that the epitaxial growth of the channel region 136 is assured to be single crystalline silicon and can extend laterally, as a side growth from the monocrystalline region 224.

In one alternative embodiment, as shown in FIG. 15B, the epitaxial layer may continue to grow vertically higher than the thickness of the layer 228 which was previously deposited. As shown in FIG. 15A, in a preferred embodiment, the layer is grown to approximately the same thickness as original layer 228 so that it attaches to the sidewall 224 along its entire horizontal width where it abuts at both ends with the layer 224 for both the P- and N-channel transistors. In the alternative embodiment shown in FIG. 15A, however, the epitaxial layer continues to be grown for a thickness approximately double or even triple the thickness of original layer 228 in order to provide a thicker channel region. Once the single crystalline silicon properly attaches to the sidewall of the layer 224, and single crystalline growth starts, it can continue for an additional thickness in order to provide a thicker channel if desired. This will often be desired for the P-channel transistor, as shown in this example, to provide a large channel volume for increased carrier mobility.

As the channels 136 and 138 are grown, some of the dopants in the source/drain regions 74, 76 and 78, 80, respectively, will enter the channel. This will provide effective LDD source/drain regions as shown in FIGS. 15A and 15B. The grown layers 136 and 138 become extensions of layer 224 into the channel. Alternatively, the channel can be doped at the edges with angle implants with dopants of the same conductivity type of the source/drains to which they attach to provide portions of the source and drains that will extend under the gate electrode to be formed in FIG. 16 for preferred transistor operation.

Figure 16:
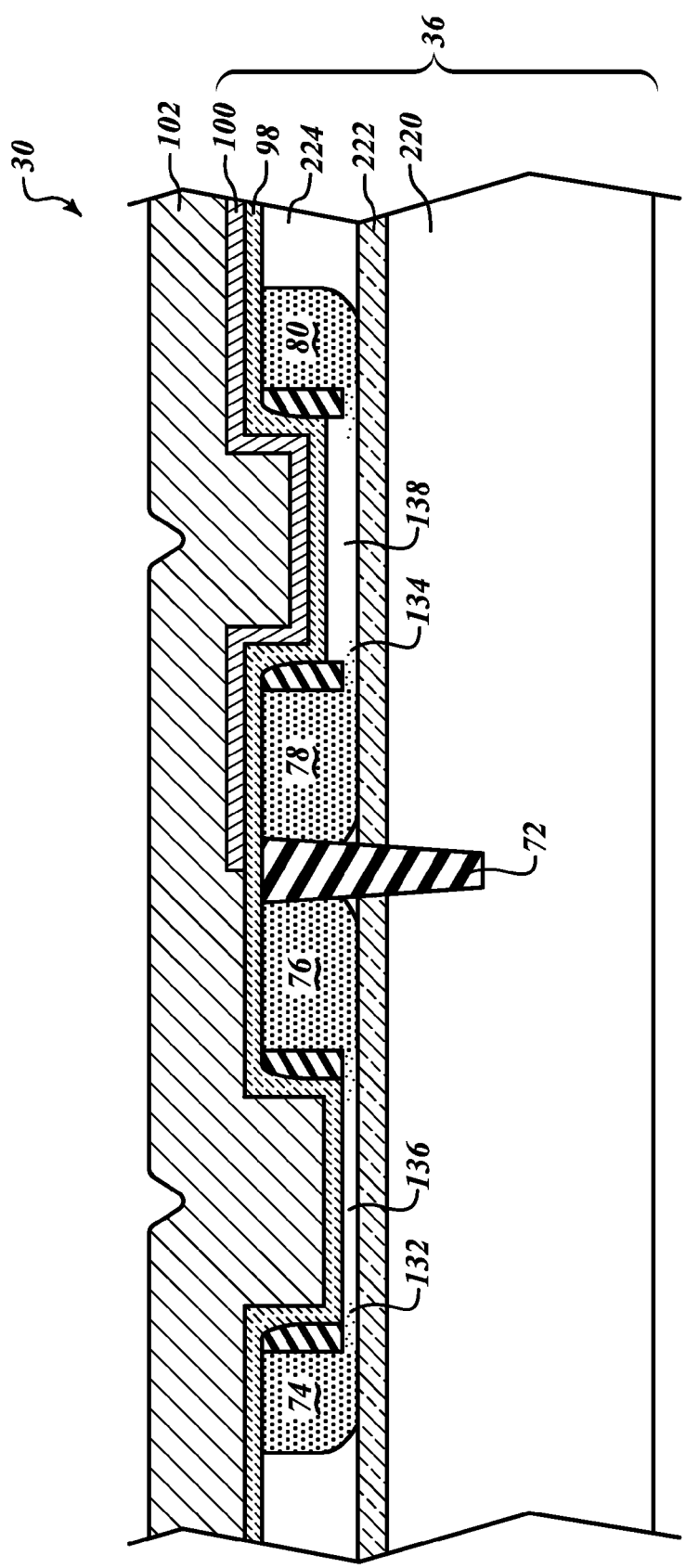

FIG. 16 illustrates a process of depositing a high dielectric constant (high K) layer 98 and metal gate stack film 102, according to this embodiment of the invention. A working function layer 100 is deposited to facilitate the operation of a P-channel FET. The various barrier layers and work function layers of the metal gate for the embodiment shown in FIG. 16 can be the same as those shown in the first embodiment.

Figure 17:
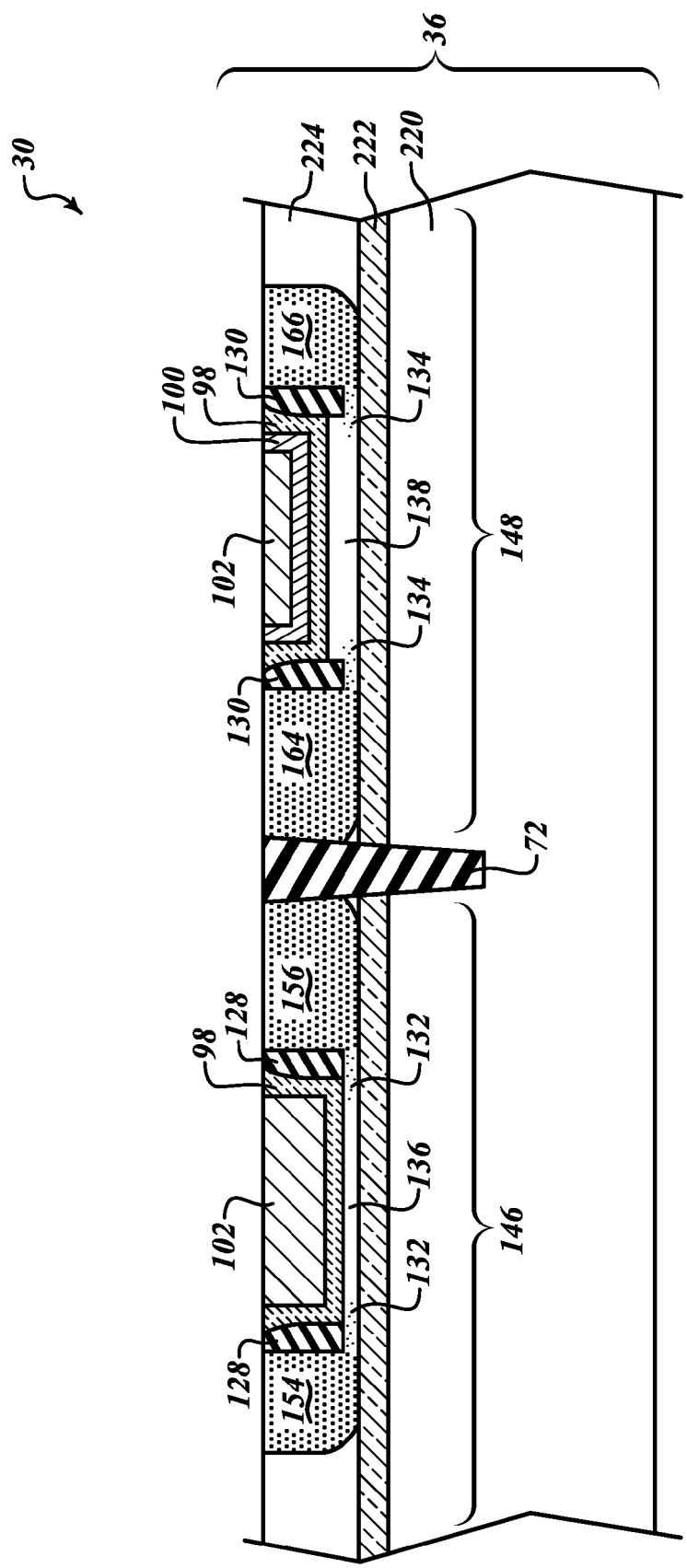

FIG. 17 illustrates semiconductor device 30 including FETs 146 and 148 formed within wafer 36 after performing a CMP of high K layer 98, working function layer 100, and metal gate stack film 102. FET 146 includes a metal gate electrode 102, a dielectric 98, spacers 128, source/drains 154 and 156, and channel 136 formed between doped extensions 132.

According to this embodiment, the lightly doped source/drain regions are formed by a slight diffusion of the dopant material of the source/drain regions 74, 76 into the channel. Namely, when the layer 136 is epitaxially grown there will be some out diffusion of the dopants in the source/drain regions into the epitaxially grown silicon region 132. This will provide a graded diffusion junction similar to an LDD junction of a transistor and, thus, provide improved characteristics due to the natural diffusion from the source/drain regions into the outer edges of the epitaxial layer as it is grown. As the epitaxial layer 136 is grown for the channel region of the transistor, it can be doped to a desired profile to have uniform doping throughout during the growing process. Alternatively, it can be grown without a dopant so that the central region is intrinsic. As a further alternative, it can be doped after growth in order to finely tune the electrical characteristics of the channel region in order to tailor the operational characteristics of the transistor, as is well known in the art. Thus, the epitaxially grown transistor channel region 132 can be formed with a particular design of the doping profile thickness in order to achieve the desired transistor operating characteristics.

Similarly, FET 148 includes a metal gate electrode 102, a work function layer 100, a dielectric 98, spacers 130, source/drains 164 and 166, and channel 138 that is formed between doped extensions 134.

FIGS. 18-23 illustrate a process of forming a semiconductor device 40, according to a third embodiment of the invention.

Figure 18:
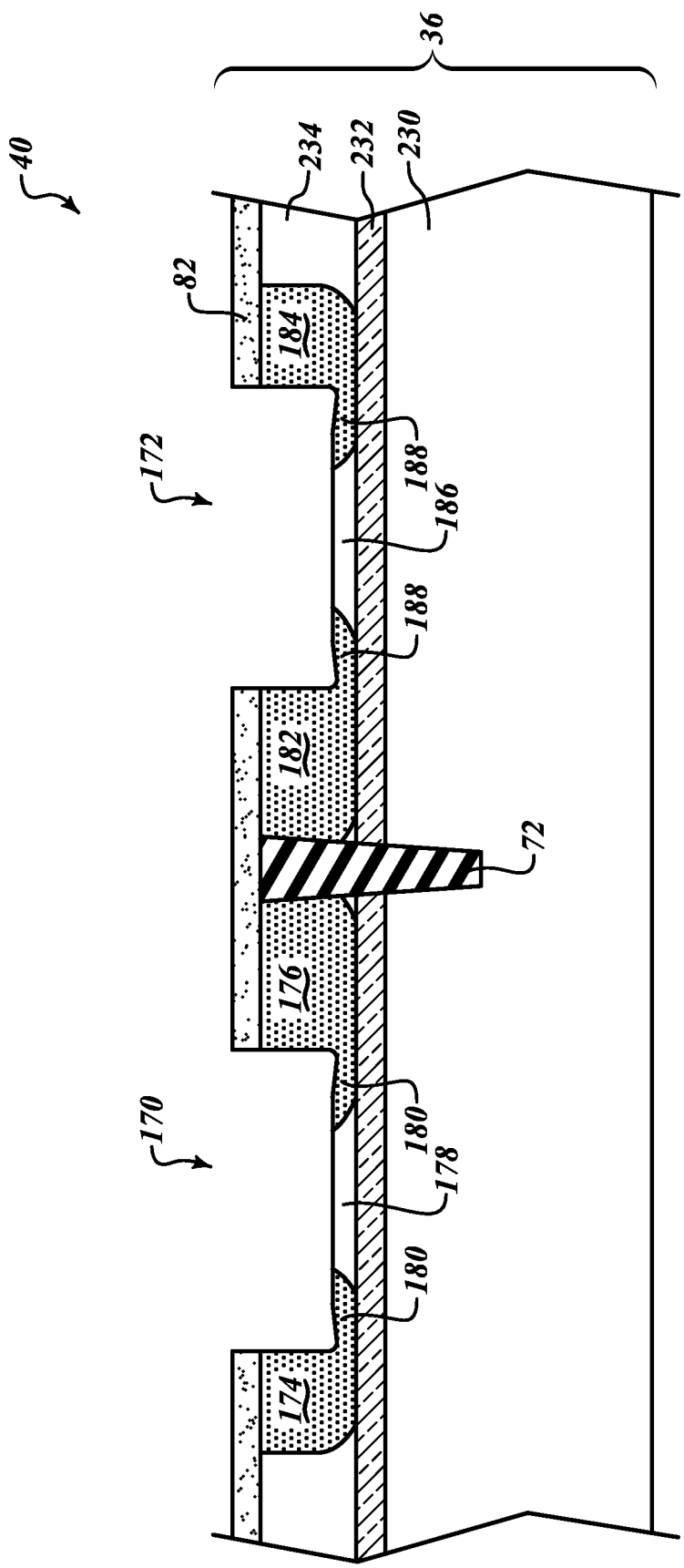
FIGS. 18-22 illustrate a process for forming an inventive semiconductor device according to a third embodiment.

FIG. 18 illustrates the formation of openings 170 and 172 in wafer 28 of semiconductor device 40, according to a third embodiment of the invention. The process steps for forming the structure as shown in FIG. 18 are the same as carried out in FIGS. 1-4 as previously explained herein. The etching of the openings 170, 172 is carried out as a timed etch rather than an etch that stops on a selected layer that was used to form apertures 86, 88, 124, 126. In particular, the etching of openings 170, 172 is carried out in a careful, controlled, and timed manner to remove only a selected amount of layer 234. Since the height of layer 234 is known prior to the beginning of the etch, regions 178, 186 in the bottom of the openings 170, 172 are of a selected height after the etch.

In the embodiment of FIG. 18, a starting wafer 36 is composed of a monocrystalline silicon substrate region 230 and a buried oxide or other insulated region 232 on top of it and a monocrystalline silicon upper layer 234 over the oxide layer 232. As previously stated with respect to the prior figures, the layer 230 can be epitaxially grown on an original wafer or the wafer 36 can be made by any acceptable technique to provide a buried oxide layer having monocrystalline silicon layers above and below.

Semiconductor device 40 includes a channel 178 formed between sources/drains 174 and 176. Channel 178 is formed on a silicon on insulator (SOI) layer 232 and is laterally enclosed by doped source/drain extensions 180. The BOx separating layer 232 is used as an isolating layer between adjacent transistors of the same type. The integrated circuit made according to these techniques of FIGS. 1-22 will normally have millions of N-channel transistors all densely packed closely to each other as well as a corresponding number of P-channel transistors. The buried oxide layer 232 provides the benefit of reducing the leakage current and avoiding cross talk between adjacent transistors of the same conductivity type to permit the N-channel transistors to be more electrically isolated from each other. This also provides the benefit of being able to more particularly tailor individual N-channel transistors or groups of N-channel transistors to have desired electrical characteristics of the source, drain and channel.

The etch to form the region 170 is a carefully timed etch to provide a channel region 178 of a desired thickness of the monocrystalline silicon region 234. Generally, the channel region may be in the range of 2-40 nm thick. The thickness of the channel region 170 can be selectively determined based on the timing of the etch, depending on the design characteristics of the particular N-channel transistor being formed. A thicker channel region will have higher current carrying capability while a more shallow channel region will have faster switching capabilities. There are other differences in the thickness of the channel region which may be considered in designing the transistor.

Also shown in FIG. 18 is that the corners 192 might be slightly deeper than the central region 178. In some etch chemistries, highly doped silicon etches more rapidly than undoped silicon. The type of etch chemistry used in the first and second embodiment is preferably the type which stops on a particular layer, such as SiGe, oxide, buried oxide, or the like, and uniformly etches silicon whether it is doped or undoped. However, in some instances the etch chemistry selected may more rapidly etch doped silicon than undoped silicon. Thus, even in the first and second embodiments, the corners of the source and drain regions may have slight curvatures of the corners 192, as shown in FIG. 18 due to the differential etch rate of doped silicon as compared to undoped silicon.

In the example shown in FIG. 18, an etch chemistry which is illustrated as having been used is one in which the more highly doped material will etch faster. Accordingly, at the more heavily doped regions near the central portion of 174, 176, the etch moves slightly more rapidly than at the outer regions of the source/drain regions 174, 176, and this edge of 174, 176, which area etches more rapidly than the undoped central region 178. Accordingly, the corners 192 will slope slightly upward to a flat portion of the channel region 178 and the depth of the corner 192 and the amount of slope will depend on the difference of the etch rates between doped and undoped silicon and the relative concentrations of dopant in the different parts of the silicon that affects the etch rates. In one embodiment, if desired, an etch chemistry can be selected which uniformly etches silicon regardless of the doping concentration, and corners 192 will not be lower than the central channel region 178 but will be more similar to that as shown in FIGS. 5 and 11.

Figure 19:
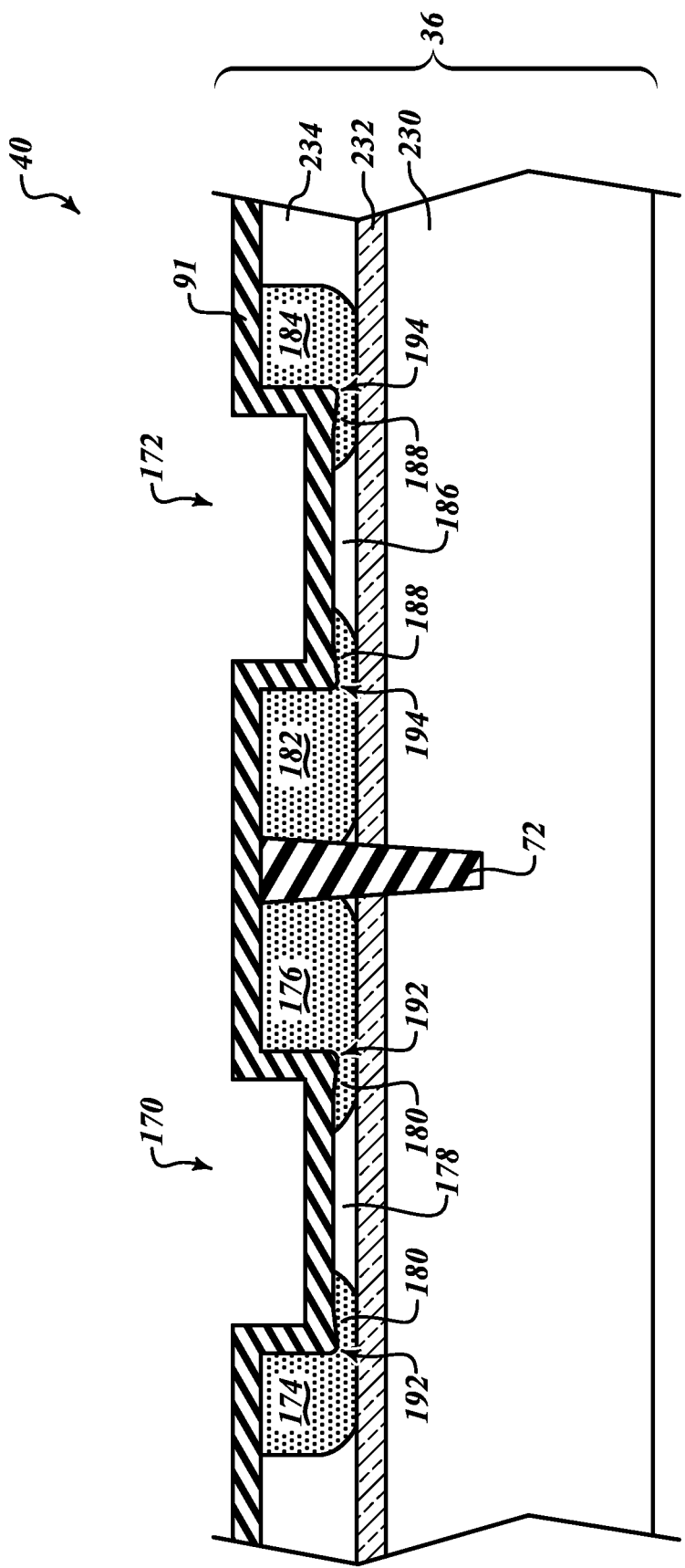

FIG. 19 illustrates a process of depositing a spacer layer 91 over silicon layer 234 and into openings 170 and 172 after performing a gate etch. The spacer layer 91 coats the sidewalls and floors of openings 170 and 172. The space layer 91 is formed with silicon nitride, according to one embodiment. The spacer layer 91 will have a thickness based on the desired channel length as previously described with respect to FIGS. 1-17. The layer 91 will conform to the corners 192 and also the upper surface 178 of the channel region. Because the opening 170 was made by a timed etch, the thickness of the channel region 178 underneath the spacer oxide 91, as well as the distance between the edges of the source/drain regions 174, 176, will be based on the amount of time in which the etch is carried out. The spacer layer 91 therefore rests on corner regions 192 of the source and drain regions as well as on the remaining portion 178 of original layer 234.

Figure 20:
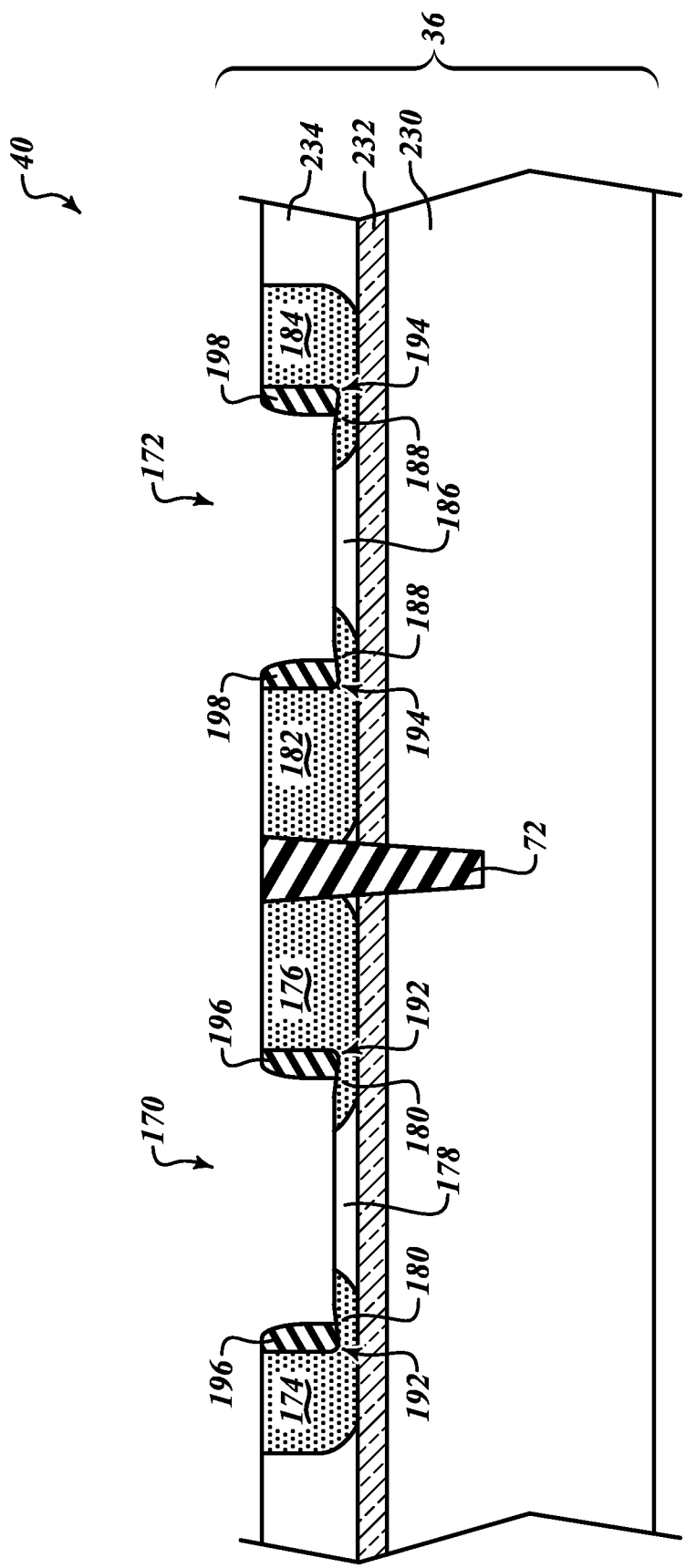

FIG. 20 illustrates a process of performing an etch to define spacer sidewalls 196 and 198 which are formed on opposite sides of channels 178 and 186, respectively. Some silicon is intentionally left at the bottom of openings 170 and 172 to function as channels 178 and 186, respectively. Doped source/drain extensions 180 and 188 extend beyond the sidewalls 196 and 198.

Figure 21:
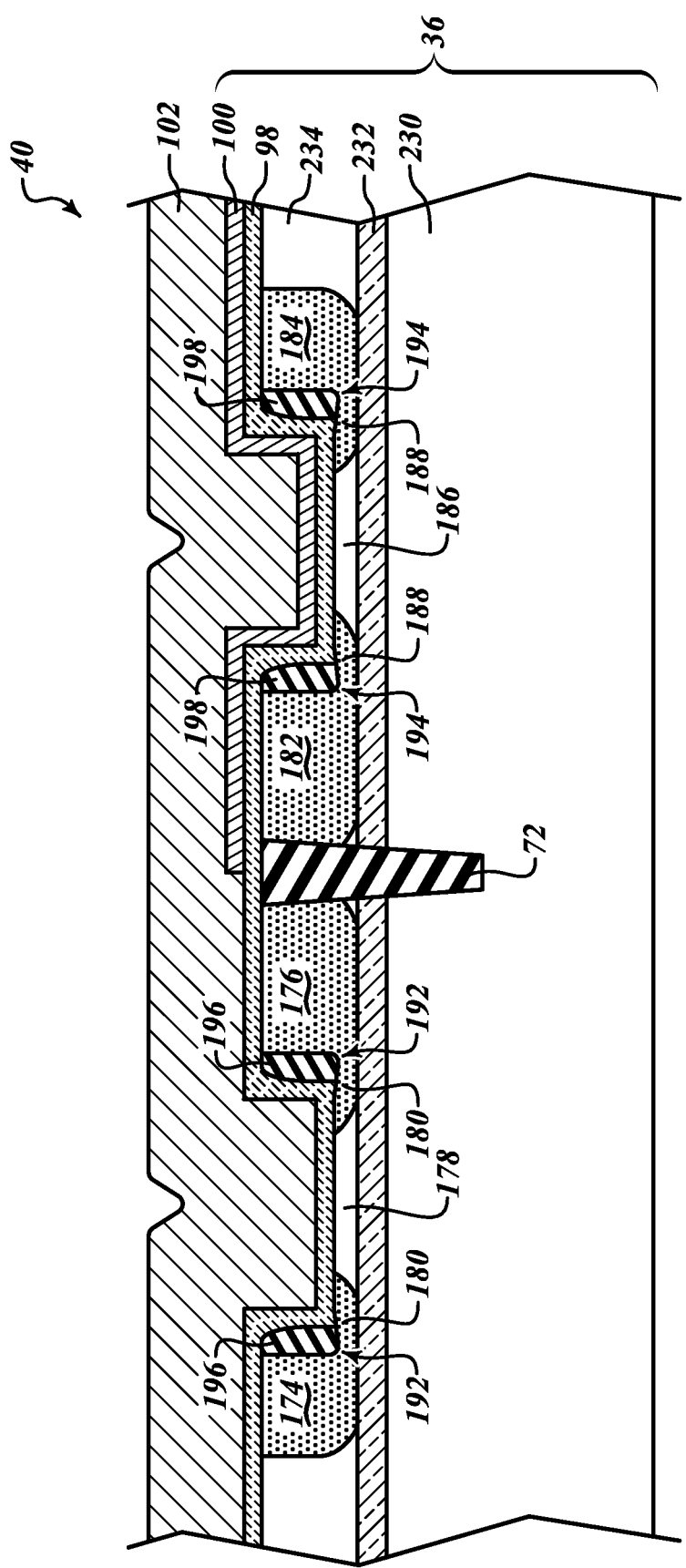

FIG. 21 illustrates a process of depositing a high dielectric constant (high K) layer 98, a P-channel working function layer 100, and metal gate stack film 102, according to an embodiment of the invention, as previously described. The working function layer 100 is deposited to facilitate the operation of a P-channel FET. The working function layer 100 is a metal alloy, according to one embodiment as previously described.

Figure 22:
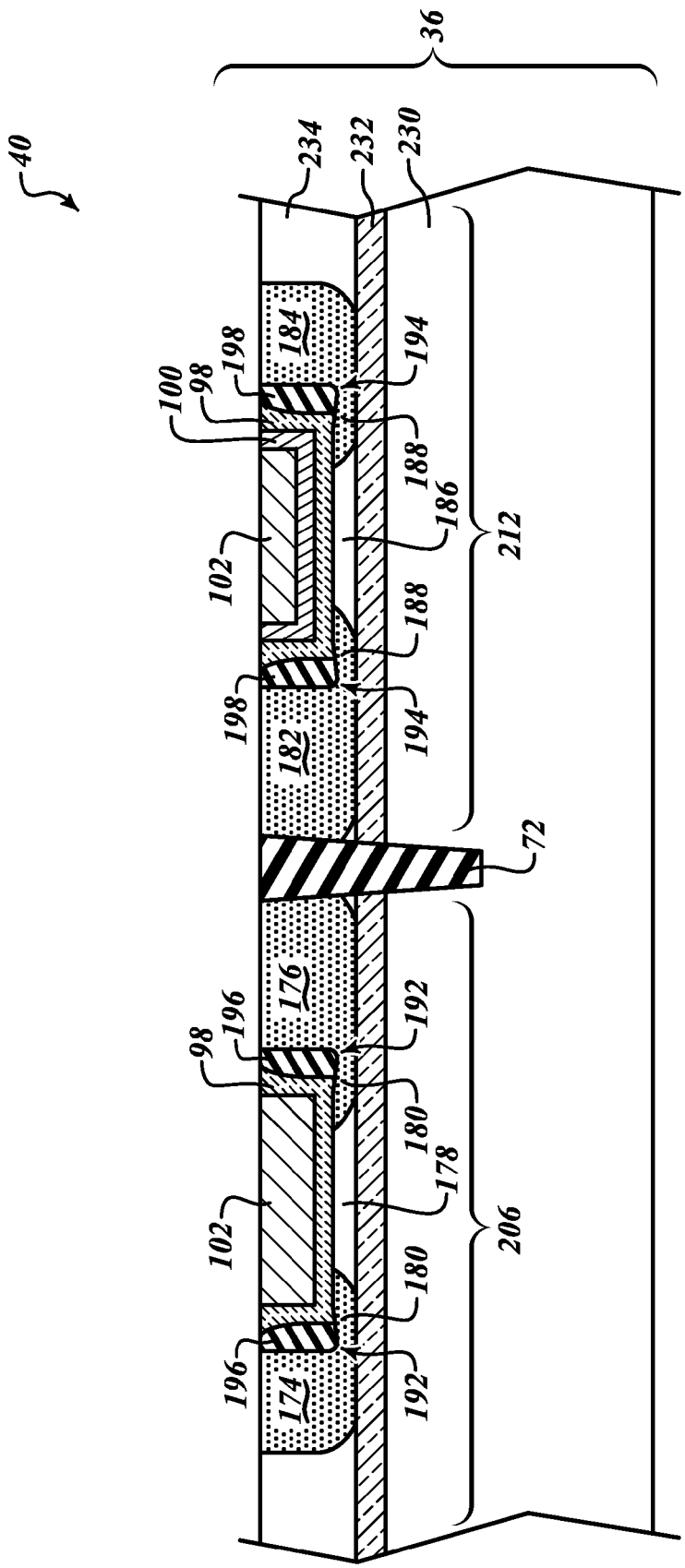

FIG. 22 illustrates a semiconductor device 40 including FETs 206, 212 formed within wafer 36 after performing a CMP of high K layer 98, working function layer 100, and metal gate stack film 102.

FET 206 includes a metal gate 102, a dielectric 98, spacers 196, source/drains 174 and 176, and channel 178 formed between doped extensions 180.

Similarly, FET 212 includes a metal gate 102, a working function layer 100, a dielectric 98, spacers 198, source/drains 182 and 184, and channel 186 that is formed between doped extensions 188.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
a semiconductor substrate region;
a channel region positioned above the semiconductor substrate region;
a source region having a first portion positioned adjacent a first side of the channel region and a second portion above the first portion and above the channel region;
a drain region having a first portion positioned adjacent a second side of the channel region and a second portion above the first portion and above the channel region;
a source sidewall spacer positioned laterally adjacent the second portion of the source region;
a drain sidewall spacer positioned laterally adjacent the second portion of the drain region;
a gate dielectric overlying the channel region and having a first end positioned adjacent the source sidewall spacer and a second end positioned adjacent the drain sidewall spacer;
a gate electrode positioned overlying the channel region and positioned laterally adjacent to the second portion of the source region and laterally adjacent to the second portion of the drain region, the gate electrode having n upper surface that is approximately coplanar with upper surfaces of the source and drain regions.

2. The semiconductor device according to claim 1 wherein the semiconductor substrate region is silicon and the channel region is composed of SiGe.

3. The semiconductor device according to claim 1 wherein the first portion of the source region extends under the source sidewall spacer and is adjacent to the channel region at a location under the gate dielectric.

4. The semiconductor device according to claim 1 wherein a portion of the gate electrode is laterally adjacent and positioned between a second portion of the source region and a second portion of the drain region.

5. The semiconductor device according to claim 1 wherein the channel length is determined based at least in part on the sum of the roots of the source sidewall spacer and the drain sidewall spacer.

6. The semiconductor device according to claim 5 wherein the channel length is also based at least in part on the thickness of the gate dielectric.

7. The semiconductor device according to claim 1, further including a first portion of the gate dielectric positioned between the source sidewall spacer and the gate electrode, and a second portion of the gate dielectric positioned between the drain sidewall spacer and the gate electrode.

8. A semiconductor device, comprising:
a semiconductor substrate region;
an epitaxially grown silicon channel region positioned above the semiconductor substrate region;
a source region having a first portion positioned adjacent a first side of the channel region and a second portion above the first portion and above the channel region;
a drain region having a first portion positioned adjacent a second side of the channel region and a second portion above the first portion and above the channel region;
a source sidewall spacer positioned laterally adjacent the second portion of the source region;
a drain sidewall spacer positioned laterally adjacent the second portion of the drain region;
a gate dielectric overlying the channel region and having a first end positioned adjacent the source sidewall spacer and a second end positioned adjacent the drain sidewall spacer;
a gate electrode positioned overlying the channel region and positioned laterally adjacent to the second portion of the source region and laterally adjacent to the second portion of the drain region; and
an electrically insulating region separating the channel region from the semiconductor substrate region.

9. A semiconductor device, comprising:
a semiconductor substrate region;
a monocrystalline silicon channel region positioned above the semiconductor substrate region;
a source region having a first portion positioned adjacent a first side of the channel region and a second portion above the first portion and above the channel region;
a drain region having a first portion positioned adjacent a second side of the channel region and a second portion above the first portion and above the channel region;

a source sidewall spacer positioned laterally adjacent the second portion of the source region;
a drain sidewall spacer positioned laterally adjacent the second portion of the drain region;
a gate dielectric overlying the channel region and having a first end positioned adjacent the source sidewall spacer and a second end positioned adjacent the drain sidewall spacer;
a gate electrode positioned overlying the channel region and positioned laterally adjacent to the second portion of the source region and laterally adjacent to the second portion of the drain region and
a dielectric layer electrically isolating the channel region from the semiconductor substrate region.

* * * * *

UNITED STATES PATENT AND TRADEMARK OFFICE
CERTIFICATE OF CORRECTION

PATENT NO. : 8,680,577 B2
APPLICATION NO. : 13/494965
DATED : March 25, 2014
INVENTOR(S) : John H. Zhang et al.

Page 1 of 1

It is certified that error appears in the above-identified patent and that said Letters Patent is hereby corrected as shown below:

In the Claims

Column 18, Lines 8-9:
"portion of the drain region, the gate electrode having n upper surface that is approximately coplanar with upper" should read, --portion of the drain region, the gate electrode having an upper surface that is approximately coplanar with upper--.

Signed and Sealed this
Fifth Day of August, 2014

Michelle K. Lee
*Deputy Director of the United States Patent and Trademark Office*